(12) United States Patent
Kim

(10) Patent No.: US 6,917,762 B2
(45) Date of Patent: Jul. 12, 2005

(54) OPTICAL TRANSMISSION SYSTEM FOR COMPENSATING FOR TRANSMISSION LOSS

(75) Inventor: Yong-Sub Kim, Songpa-gu (KR)

(73) Assignee: Samsung Electronics Co., Ltd. (KR)

( * ) Notice: Subject to any disclaimer, the term of this patent is extended or adjusted under 35 U.S.C. 154(b) by 486 days.

(21) Appl. No.: 09/751,182

(22) Filed: Dec. 29, 2000

(65) Prior Publication Data

US 2001/0021051 A1 Sep. 13, 2001

(30) Foreign Application Priority Data

Dec. 29, 1999 (KR) ........................................ 1999-65072

(51) Int. Cl.[7] .............................................. H04B 10/00
(52) U.S. Cl. ...................... 398/158; 398/136; 398/137; 398/139; 398/141; 398/155; 398/158; 398/162; 341/100; 341/101; 348/359; 348/500; 714/48
(58) Field of Search .............................. 398/20, 32, 33, 398/23–24, 154–155, 158, 162, 195, 197, 198, 206, 209, 213, 139, 136–137, 141; 370/529, 527; 331/25; 341/100–101; 348/359, 500; 714/48

(56) References Cited

U.S. PATENT DOCUMENTS

| | | | | |
|---|---|---|---|---|
| 4,290,146 A | * | 9/1981 | Adolfsson et al. ............. | 398/38 |
| 4,727,592 A | * | 2/1988 | Okada et al. ................. | 714/55 |
| 5,018,142 A | * | 5/1991 | Simcoe et al. .............. | 370/537 |
| 5,390,041 A | * | 2/1995 | Knecht et al. ............... | 398/182 |
| 5,506,716 A | * | 4/1996 | Mihara et al. ............... | 398/137 |
| 5,561,542 A | * | 10/1996 | Kosugi et al. ................ | 398/58 |
| 5,677,779 A | * | 10/1997 | Oda et al. .................... | 398/137 |
| 5,706,112 A | * | 1/1998 | Morita et al. ............... | 398/162 |
| 5,978,393 A | * | 11/1999 | Feldman et al. .............. | 372/31 |
| 6,188,498 B1 | * | 2/2001 | Link et al. ................... | 398/195 |
| 6,195,370 B1 | * | 2/2001 | Haneda et al. ........... | 372/29.01 |
| 6,211,714 B1 | * | 4/2001 | Jeong ......................... | 327/293 |
| 6,256,329 B1 | * | 7/2001 | Ishizuka et al. .......... | 372/38.02 |
| 6,292,284 B1 | * | 9/2001 | Takauji et al. .............. | 398/197 |
| 6,356,374 B1 | * | 3/2002 | Farhan ....................... | 398/191 |
| 6,363,441 B1 | * | 3/2002 | Bentz et al. .................. | 710/58 |
| 6,559,892 B1 | * | 5/2003 | Kikuchi ....................... | 348/536 |
| 6,628,214 B1 | * | 9/2003 | Kawase et al. ............. | 341/100 |

FOREIGN PATENT DOCUMENTS

| | | | | |
|---|---|---|---|---|
| JP | | 6021898 | 1/1994 | ..................... 10/18 |

\* cited by examiner

*Primary Examiner*—Kinfe-Michael Negash
(74) *Attorney, Agent, or Firm*—Mills & Onello LLP

(57) ABSTRACT

An optical transmission system for compensating for transmission loss includes a transmitting apparatus for serializing a plurality of n (n is a natural number)-bit channel data received from the outside in response to a predetermined clock signal, converting the serialized channel data and the predetermined clock signal into a current signal whose magnitude changes corresponding to an error detection signal, and outputting optical signals having optical output power corresponding to the magnitude of the current signal, a first optical fiber for transmitting the optical signals, a receiving apparatus for recovering the n-bit channel data and the predetermined clock signal from the optical signals received through the first optical fiber, detecting transmission loss generated when the optical signals are transmitted and received, optically converting the transmission loss, and outputting the optically converted transmission loss as the error detection signal, and a second optical fiber for transmitting the optical converted error detection signal to the transmitting apparatus. Since the receiving apparatus and the transmitting apparatus forms a closed loop, it is possible to keep optical efficiency uniform, corresponding to the transmission loss transmitted by the receiving apparatus. Also, the parallel/serial data converter is realized by the gate, it is possible to convert data at high speeds of greater than the GHz level and to reduce the size of the circuit. Also, it is possible to reduce power consumption since the non-overlapping clock signals whose frequencies are relatively low are used even when data is converted at high speeds greater than the GHz level.

16 Claims, 12 Drawing Sheets

US 6,917,762 B2

OPTICAL TRANSMISSION SYSTEM FOR COMPENSATING FOR TRANSMISSION LOSS

BACKGROUND OF THE INVENTION

1. Field of the Invention

The present invention relates to an optical transmission system, and more particularly, to an optical transmission system for compensating for transmission loss, an optical signal transmitting/receiving apparatus of the optical transmission system for compensating for transmission loss, and a parallel/serial data converter for transmitting high speed data in the transmitting apparatus.

2. Description of the Related Art

An optical transmission system includes an optical signal transmitting apparatus, an optical fiber, and an optical signal receiving apparatus. The transmitting apparatus converts an electrical signal to be transmitted into an optical signal, using a laser diode. The optical fiber transmits the optical signal converted by the transmitting apparatus to a receiving apparatus. The receiving apparatus receives the optical signal transmitted through the optical fiber at a photo diode and converts the received signal into an electrical signal.

The transmitting apparatus provides driving current to the laser diode in order to output the optical signal using the laser diode. Namely, the transmitting apparatus controls the driving current and controls the optical output power of the laser diode. Conventional transmitting apparatus commonly control the amount of driving current by controlling an external resistance value.

FIG. 1 is a schematic block diagram showing a conventional single channel optical signal transmission system. Referring to FIG. 1, a transmitting apparatus 10 includes an optical driver 12, a bias and modulation current controller 14, a bias resistor $R_{bias}$, a modulation resistor $R_{mod}$, and a laser diode 16. A receiving apparatus 20 includes an optical receiver 26 and a photo diode 24. Here, the bias resistor $R_{bias}$ and the modulation resistor $R_{mod}$ can exist outside the transmitting apparatus 10.

In FIG. 1, the optical driver 12 of the transmitting apparatus 10 converts externally-received input data DIN into a current signal. The optical driver 12 further changes the magnitude of the converted current signal in response to the bias current $I_{bias}$ and the modulation current $I_{mod}$, which are provided by the bias and modulation current controller 14. The magnitudes of the bias current $I_{bias}$ and the modulation current $I_{mod}$ can be controlled by changing the magnitudes of the bias resistor $R_{bias}$ and the modulation resistor $R_{mod}$. Also, the optical driver 12 generates a magnitude-variant current signal as the driving current for driving the laser diode 16. The laser diode 16 generates an optical signal having an optical output power corresponding to the driving current. The optical signal generated by the laser diode 16 is transmitted to the receiving apparatus 20 through an optical fiber 18. The photo diode 24 of the receiving apparatus 20 receives the optical signal transmitted from the optical fiber 18 and converts the received optical signal into a current signal. The optical receiver 26 recovers original data from the current signal converted by the photo diode 24. In FIG. 1, DOUT represents recovered data.

The conventional optical transmission system shown in FIG. 1 controls the amount of driving current $I_d$ output from the optical driver 12 by changing the magnitudes of the bias resistor $R_{bias}$ and the modulation resistor $I_{mod}$, thus controlling the magnitudes of the bias current $I_{bias}$ and the modulation current $I_{mod}$. Namely, the optical output power of the laser diode 16 is controlled by changing the resistances of the bias resistor $R_{bias}$ and the modulation resistor $R_{mod}$.

The conventional optical transmission system shown in FIG. 1 is an open loop system, in which the optical output power of the laser diode 16 can be controlled only at the transmission end.

For example, when transmission loss is generated while the optical signal is transmitted through the optical fiber, or received by the receiving apparatus, errors can be generated in the data recovered by the optical receiver of the receiving apparatus. Therefore, the transmitting apparatus transmits an optical signal having appropriate optical output power so that the optical transmission system can maintain a predetermined transmission efficiency, taking into account transmission loss. The transmission efficiency can change according to the characteristics of the devices used for the optical transmission system such as the optical diodes for transmission, the optical fibers, and the optical diodes for reception. Also, the transmission efficiency of the optical transmission system can change as the length of the optical fiber changes. Also, the transmission efficiency of the optical transmission system can change since the characteristics of the devices used as the optical fiber may not optimally match. Transmission loss can be different from what was expected due to the change in the transmission efficiency. Accordingly, errors can be generated in the data recovered by the optical receiver of the receiving apparatus.

Also, in the case of a multi-channel optical transmission system for transmitting multimedia data such as graphic data, uniformities of the laser diode, the optical fiber and the photo diode can vary in each channel. Therefore, in the case of the multi-channel optical transmission system, transmission efficiency varies in each channel. Accordingly, errors can be generated when data is transmitted.

In the conventional open-loop optical transmission system, the optical output power is controlled according to the characteristics of the transmitting apparatus. However, the change in transmission efficiency according to the characteristics of the optical fiber and the receiving apparatus is not taken into account. Namely, the transmission efficiency changes due to the characteristics of the optical fiber and the receiving apparatus. Accordingly, it is not possible to compensate for errors generated when data is transmitted.

Also, in order to minimize the change in transmission efficiency caused by the characteristics of the optical fiber and the receiving apparatus, the error allowance range of the standards of the devices used for the optical transmission system must be small. Therefore, when the conventional optical transmission system of the open loop is constituted, restrictions are placed on selection of the devices. Accordingly, it is expensive to constitute the optical transmission system.

SUMMARY OF THE INVENTION

To address the above issues, it is an object of the present invention to provide an optical transmission system for compensating for transmission loss so that the transmission efficiency of an optical transmission system is kept uniform regardless of the characteristics of an optical fiber and a receiving apparatus.

It is another object of the present invention to provide a transmitting apparatus for an optical transmission system for compensating for transmission loss.

It is another object of the present invention to provide a receiving apparatus for an optical transmission system for compensating for transmission loss.

It is another object of the present invention to provide a parallel/serial data converting circuit for transmitting data at high speed in the transmitting apparatus for optical transmission.

Accordingly, to achieve the first object, according to an aspect of the present invention, there is provided an optical transmission system for compensating for transmission loss, comprising a transmitting apparatus for serializing a plurality of n-bit (where n is a natural number), externally-received channel data in response to a predetermined clock signal, converting the serialized channel data into a first current signal and the predetermined clock signal into a second current signal whose magnitude changes in accordance with an error detection signal, and outputting optical signals having optical output power corresponding to the magnitude of the current signals, a first optical fiber for transmitting the optical signals, a receiving apparatus for recovering the n-bit channel data and the predetermined clock signal from the optical signals received through the first optical fibers, detecting transmission loss generated when the optical signals are transmitted and received, optically converting the transmission loss, and outputting the optically converted transmission loss as the error detection signal, and a second optical fiber for transmitting the converted error detection signal to the transmitting apparatus.

To achieve the first object, according to another aspect of the present invention, there is provided an optical transmission system for compensating for transmission loss, comprising a transmitting apparatus for serializing a plurality of externally-received n-bit channel data in response to a predetermined clock signal, converting the serialized channel data and the predetermined clock signal into a first and second current signals whose magnitudes change in accordance with an error detection signal, and outputting optical signals having optical output power corresponding to the magnitude of the current signals, optical fibers for transmitting the optical signals, a receiving apparatus for recovering the n-bit channel data and the predetermined clock signal from optical signals received by the optical fibers and outputting transmission loss generated when the optical signals are transmitted and received as the error detection signal, and an electrical transmission line for transmitting the error detection signal to the transmitting apparatus.

To achieve the second object, according to an aspect of the present invention, there is provided a transmitting apparatus for receiving transmission loss detected by an external receiving apparatus through a first optical fiber and transmitting a plurality of channel data items to the receiving apparatus through a second optical fiber, comprising a PLL for generating a clock signal synchronized with a predetermined clock signal received from the outside and outputting the synchronized clock signal as an actual clock signal for transmitting data, a parallel/serial data converter for receiving a plurality of external n-bit channel data in response to the synchronized clock signal and serializing the n-bit channel data in response to the synchronized clock signal, an optical diode for reception for converting an error detection signal transmitted from the first optical fiber into a current signal and outputting the current signal, an error compensating optical driver for converting channel data serialized by the parallel/serial data converter and the synchronized clock signal into current signals, changing the magnitudes of the converted current signals, corresponding to the current signal converted by the optical diode for reception, and outputting the current signals as driving signals, and a plurality of optical diodes for transmission for outputting optical signals having optical output power corresponding to the driving signals.

To achieve the third object, according to an aspect of the present invention, there is provided a receiving apparatus for receiving channel data items transmitted from an external transmitting apparatus through an optical fiber and recovering the channel data items from a received optical signal, comprising a plurality of optical diodes for reception of external optical signals and converting the optical signals into current signals, an error detection optical receiver for converting the current signals converted by the plurality of optical diodes for reception into voltage signals, digitizing the voltage signals, outputting the digitized voltage signals as recovered serial channel data and a recovered clock signal, detecting transmission loss of each channel from the voltage signals, encoding the transmission loss, converting the encoded transmission loss into current, and outputting the current, a PLL for generating a synchronized clock signal synchronized with the recovered clock signal and outputting the synchronized clock signal as an actual clock signal for receiving data, a data recovery unit for recovering the recovered serial channel data to n-bit parallel data in response to the synchronized clock signal, and an optical diode for transmission for converting the signal encoded and inverted into current by the error detection unit into an optical signal.

To achieve the fourth object, according to an aspect of the present invention, there is provided a parallel/serial data converting circuit of a transmitting apparatus, comprising a phase locked loop (PLL) for generating first through nth overlapping clock signals having a predetermined offset so as not to overlap each other and inverted first through nth overlapping clock signals by inverting the first through nth overlapping clock signals, the parallel/serial data converting circuit for converting channel data items of n bit, which are input from an external source, into serial information data in response to the first through nth overlapping clock signals and transmitting the converted data, comprising a data latch for receiving the n-bit channel data and segmenting the received n-bit channel data by N bits and latching the segmented channel data in response to first through mth latch clock signals and a data serializer for performing a logic operation on the n-bit channel data latched by the data latch, the first through nth non-overlapping clock signal and the inverted first through nth non-overlapping clock signal and outputting the logic operation result as serial channel data.

BRIEF DESCRIPTION OF THE DRAWING(S)

The above objects and advantages of the present invention will become more apparent by describing in detail a preferred embodiment thereof with reference to the attached drawings in which.

DETAILED DESCRIPTION OF PREFERRED EMBODIMENTS

Figure 1:
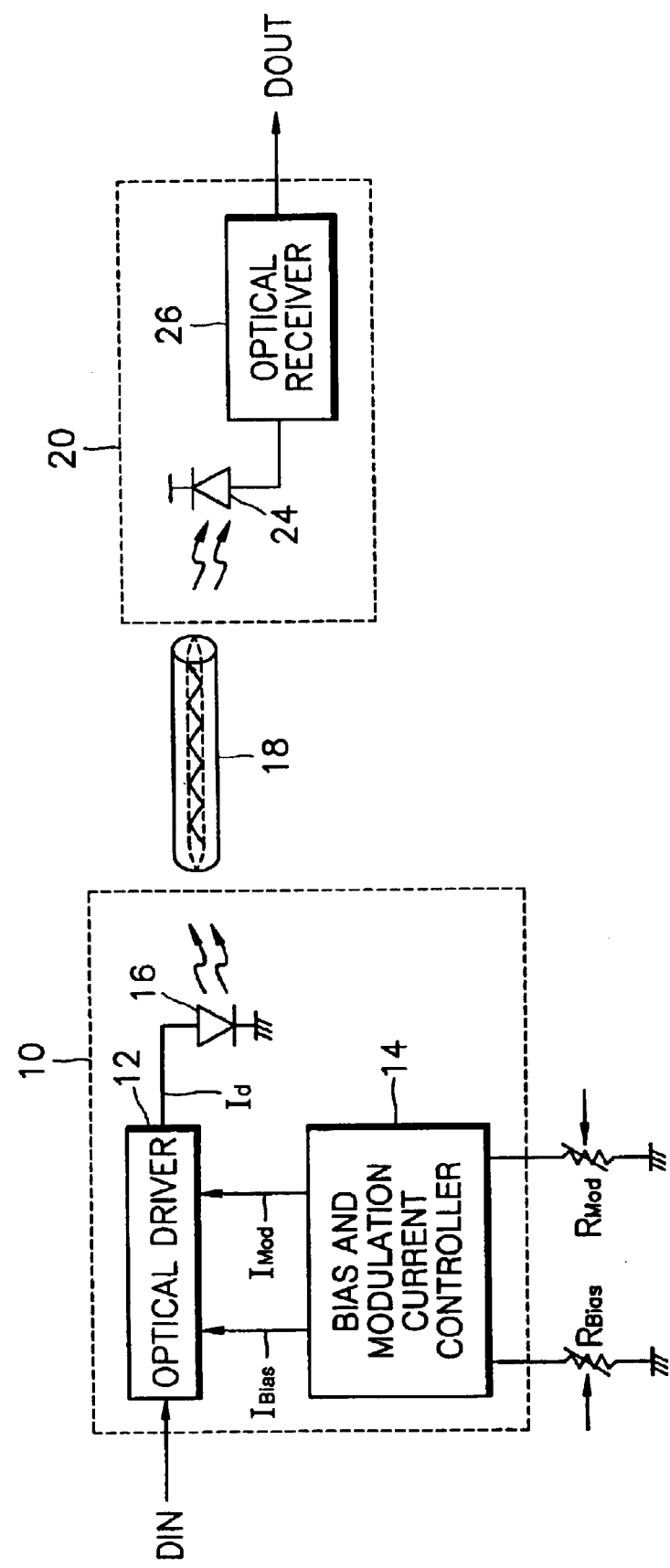
FIG. 1 is a schematic block diagram showing a conventional single channel optical signal transmission system.
Figure 2:
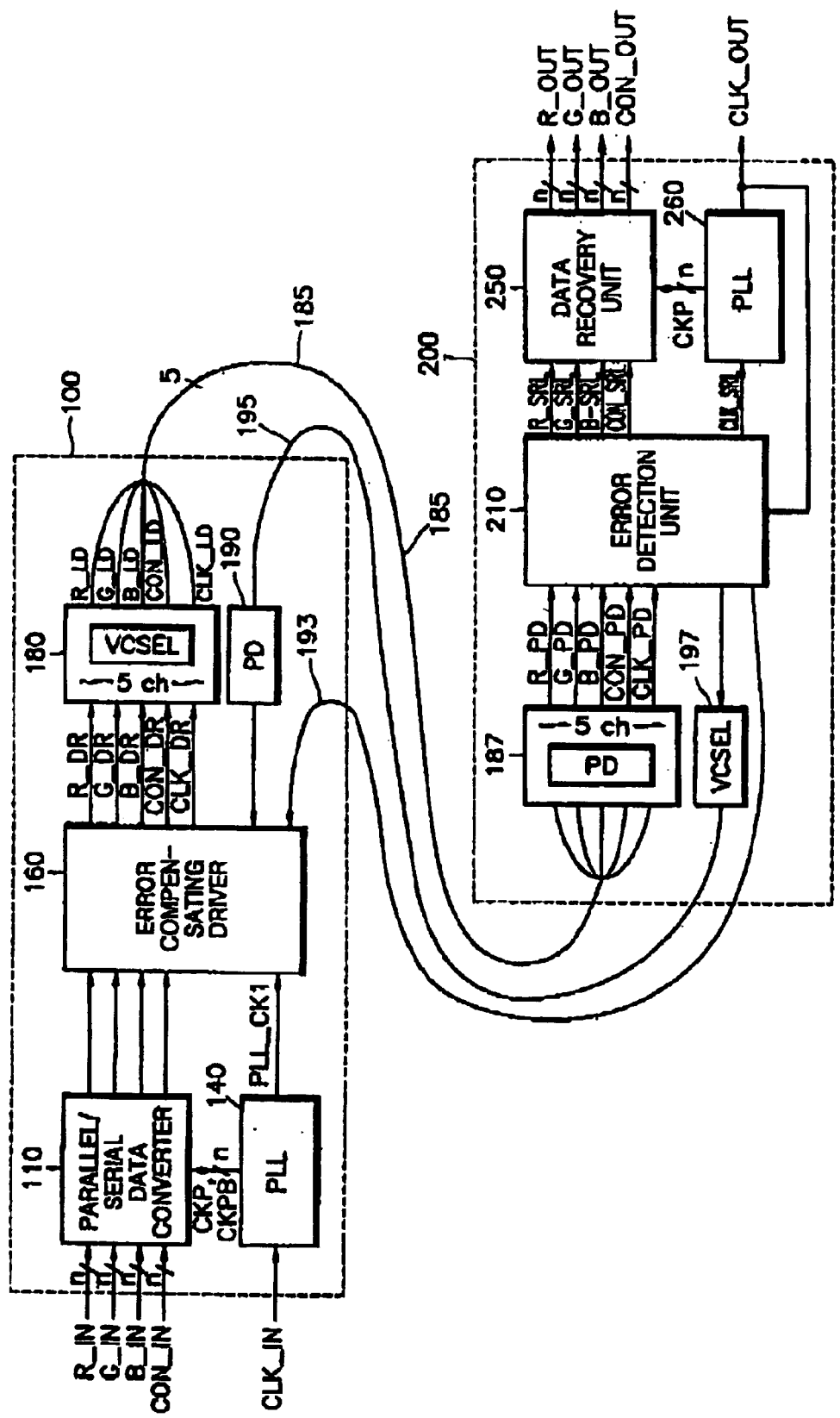
FIG. 2 is a schematic block diagram showing an optical transmission system for compensating for transmission loss according to an embodiment of the present invention.

FIG. 2 is a schematic block diagram showing an optical transmission system for compensating for transmission loss according to an embodiment of the present invention. The optical transmission system includes a transmitting apparatus 100, first and second optical fibers 185 and 195, and a receiving apparatus 200. The second optical fiber 195 can be replaced by an electrical transmission line 193. In the present specification, the optical transmission system using the second optical fiber 195 will be described.

The transmitting apparatus 100 serializes n-bit channel data items received from an external source in response to a predetermined clock signal CLK. The transmitting apparatus 100 converts the serialized channel data items and predetermined clock signal CLK into optical signals and outputs the optical signals. The transmitting apparatus 100 can change the output power of the respective optical signals output from the transmitting apparatus 100 in response to an error detection signal transmitted through the second optical fiber 195. In an embodiment of the present invention, for the convenience of explanation, n-bit channel data items are R/G/B color signals and a control signal CON. Also, the transmitting apparatus 100 inputs the R/G/B color signals and the control signal CON through input terminals R_IN, G_IN, B_IN, and CON_IN, respectively. Also, the predetermined clock signal CLK is received through an input terminal CLK_IN. The control signal CON includes horizontal/vertical synchronous signals HSYNC and VSYNC and a data enable signal DE.

The R/G/B color signals and the control signal CON input to the transmitting apparatus 100 can be data scrambled by an external scrambler. Here, in the scrambled data, the number of high levels and low levels of digital data input in response to the predetermined clock signal CLK is counted and the count is added to the respective channel data items as direct current (DC) balance information. Namely, direct current balance information added by the scrambler shows that the high levels and the low levels of the respective data bits are well-balanced in digital transmission. The DC balance information determines the level of data when data is recovered by a receiver. In the present specification, for convenience of explanation, the R/G/B color signal and the control signal CON input to the transmitting apparatus 100 are scrambled data of nine bits.

A first optical fiber 185 transmits an optical signal output from the transmitting apparatus 100 to a receiving apparatus 200.

The receiving apparatus 200 receives optical signals transmitted from the first optical fiber 185 and recovers the R/G/B color signals and the control signal CON of n bits which are original digital signals and the predetermined clock signal CLK. In FIG. 2, R_OUT, G_OUT, B_OUT, and CON_OUT denote the recovered R/G/B color signals and control signal and CLK_OUT denotes the recovered predetermined clock signal. Also, the receiving apparatus 200 detects transmission loss generated when the optical signals output from the transmitting apparatus 100 to the respective channels are transmitted through the first optical fiber 185 and when the optical signals are received by the receiving apparatus 200. The receiving apparatus 200 converts the detected transmission loss into an optical signal and outputs the converted optical signal as an error detection signal.

A second optical fiber 195 transmits the error detection signal output from the receiving apparatus 200 to the transmitting apparatus 100.

The optical transmission system according to an embodiment of the present invention is constituted of a closed loop, in which transmission loss is detected by the receiving apparatus 200 and the detected transmission loss is fed back to the transmitting apparatus 100. Namely, the power of the optical signal output from the transmitting apparatus 100 can be self-controlled corresponding to the error detection signal transmitted from the receiving apparatus 200 without external control. Namely, the receiving apparatus 200 of the optical transmission system shown in FIG. 2 detects the transmission loss generated due to the change in transmission efficiency caused by the characteristics of the first optical fiber 185 and the receiving apparatus 200 and generates an error detection signal based on the transmission loss. Also, the transmitting apparatus 100 can keep the transmission efficiency uniform without external control by controlling the optical output power in the transmitting apparatus 100, corresponding to the error detection signal.

Also, since the optical transmission system according to the present invention keeps the transmission efficiency uniform, devices having large error allowance ranges can be used for the optical transmission system. Namely, the transmission efficiency of the optical transmission system deteriorates when devices have large error allowance ranges, the receiving apparatus 200 detects the transmission loss caused by the deterioration of the transmission efficiency and transmits the detected transmission loss. Since the transmitting apparatus 100 increases the optical output power according to the detected transmit loss, the deterioration of the transmission efficiency of the optical transmission system is prevented. It is therefore possible to reduce the cost of an optical transmission system since it is possible to use devices having large error allowance ranges.

Referring to FIG. 2, the transmitting apparatus 100 includes a parallel/serial data converter 110, a phase locked loop (PLL) 140, an error compensating driver 160, optical diodes 180 for transmission, and optical diodes 190 for reception.

The PLL 140 generates a first synchronized clock signal PLL_CK1 synchronized with a predetermined clock signal CLK received from the input terminal CLK_IN. The PLL 140 outputs the first synchronized clock signal PLL_CK1 to the error compensating driver 160 as an actual clock signal for data transmission. The PLL 140 uses the clock signal CLK having a frequency of, for example, 25 MHz through 162 MHz as an input in the case of high-speed transmission having a transmission speed on the GHz order. Also, the PLL 140 generates non-overlapping clock signals CKP and inverted non-overlapping clock signals for data serialization performed by the parallel/serial data converter 110, using the first synchronized clock signal PLL_CK1. The PLL 140 outputs the generated non-overlapping clock signals CKP and inverted non-overlapping clock signals CKPB to the parallel/serial data converter 110. The PLL 140 will now be described in further detail below with reference to FIG. 3.

The parallel/serial data converter 110 serializes the input n-bit channel data in response to the non-overlapping clock signal CKP and the inverted non-overlapping clock signal CKPB. Also, the parallel/serial data converter 110 outputs the converted serial channel data items to the error compensating driver 160. If parallel data is not converted into serial data, as many channels as the number of bits constituting the R/G/B color signals and as many channels as the number of bits constituting the control signal CON are required. For example, 36 channels are required in order to transmit the R/G/B color signals and the control signal CON of nine bits in parallel in FIG. 2. However, when parallel data is converted into serial data and then, transmitted as in the present invention, it is possible to transmit the R/G/B color signals and the control signal CON of nine bits using four channels.

When the optical transmission system transmits graphic data as in an embodiment of the present invention, the amount of data to be processed increases as the display screen size and resolution increases. Therefore, the frequency of the clock signal CLK for processing data increases and the transmission speed of the serialized data increases. Table 1 shows the frequency of the clock signal CLK according to resolution and the transmission speed of the serialized data according to the resolution, when the input data is nine-bit parallel data.

TABLE 1

| Resolution | Frequency of clock signal (CLK) | Transmission speed of serialized data |
| --- | --- | --- |
| 640 × 480 | 25 MHz | 225 Mbps |
| 1024 × 768 | 65 MHz | 585 Mbps |
| 1280 × 1024 | 112 MHz | 1.008 Gbps |
| 1600 × 1200 | 162 MHz | 1.458 Gbps |

Referring to Table 1, the serialized data may need to be transmitted at high speeds on the GHz order according to the increase in the resolution. In general, a shift register realized by flip-flops is used as the parallel/serial data converter. When the parallel/serial data converter is realized using the flip-flops, it is not possible to process high speed data on the GHz order due to the holding and setting time of the flip-flop. Therefore, the parallel/serial data converter is required to be realized by devices gated for a short time in order to process high speed data on the GHz order. The parallel/serial data converter 110 will be described in further detail below with reference to FIG. 6.

In FIG. 2, the optical diode 190 for reception can generally be realized by a photo diode. Also, the optical diode 190 for reception converts the error detection signal which is an optical signal received from the second optical fiber 195 into a current signal and outputs the current signal.

The error compensating driver 160 receives the serialized channel data items from the parallel/serial data converter 110 and the first synchronized clock signal PLL_CK1 from the PLL 140 and converts the channel data items into a current signal. Also, the error compensating driver 160 changes the magnitude of modulation current or bias current, corresponding to the current signal converted by the optical diode for reception 190. Also, the error compensating driver 160 generates driving signals for driving the optical diodes for reception 180 by reflecting the modulation current and the bias current to a signal, in which the respective channel data are converted into current. In FIG. 2, R_DR, G_DR, and B_DR denote driving signals corresponding to the respective R/G/B color signals. CON_DR and CLK_DR denote driving signals corresponding to the control signal CON and the clock signal CLK, respectively. The error compensating driver 160 will be described in further detail below with reference to FIG. 11.

The optical diodes 180 for transmission can generally be realized by laser diodes such as a vertical cavity surface emitting laser (VCSEL). Also, the optical diodes 180 for transmission output optical signals having optical output power corresponding to the respective driving signals output from the error compensating driver 160. In FIG. 2, R_LD, G_LD, and B_LD denote the R/G/B color signals converted into optical signals, respectively. Also, CON_LD and CLK_LD denote the control signal CON and the clock signal CLK, which are converted into optical signals.

Referring to FIG. 2, the receiving apparatus 200 includes optical diodes 187 for reception, an optical diode for transmission 197, an error detection unit 210, a data recovery unit 250, and a phase locked loop (PLL) 260.

The optical diodes 187 for reception can be realized by the photo diodes as mentioned above. Also, the optical diodes 187 for reception receive optical signals transmitted through the first optical fiber 185 and convert the optical signals into current signals. In FIG. 2, R_PD, G_PD, and B_PD denote the R/G/B signals converted into optical signals and transmitted through the first optical fiber 185. CON_PD and CLK_PD denote the control signal CON and the clock signal CLK, which are converted into optical signals and transmitted through the first optical fiber 185.

The error detection unit 210 converts the current signals received from the optical diodes 187 for reception into voltage signals and converts the voltage signals into digital signals. The digitized signals are output to the data recovery unit 250 and the PLL 260 as the recovered serial channel data and the recovered clock signal. In FIG. 2, R_SRL, G_SRL, B_SRL, and CON_SRL denote recovered serial channel data, respectively. Also, CLK_SRL denotes a recovered clock signal. Also, the error detection unit 210 detects transmission loss caused by the first optical fiber 185 and the optical diodes 187 for reception from the received current signals in each channel. The detected transmission loss in each channel is encoded and converted into current in response to the recovered clock signal CLK_OUT and is output to the optical diode 197 for transmission. The error detection unit 210 will be described in further detail below with reference to FIG. 13.

The PLL 260 outputs a second synchronized clock signal, which is synchronized with the recovered clock signal CLK_SRL generated by the error detection unit 210, as the recovered predetermined clock signal CLK_OUT. Also, the PLL 260 generates non-overlapping clock signals CKP having a predetermined offset so as not to overlap each other, using the second synchronized clock signal CLK_OUT and outputs the non-overlapping clock signals CKP to the data recovery unit 250. Here, the non-overlapping clock signals CKP are used for data recovery performed by the data recovery unit 250.

The data recovering unit 250 recovers the serial channel data recovered from the error detection unit 210 to channel data of n bits in response to the second synchronized clock signal CLK_OUT. In FIG. 2, R_OUT, G_OUT, B_OUT, and CON_OUT denote the recovered R/G/B color signals and control signal CON of n bits, respectively.

The optical diode 197 for transmission can be realized by a laser diode. Also, the optical diode 197 for transmission converts the signal encoded and converted into current by the error detection unit 210 into an optical signal and outputs the converted optical signal as the error detection signal.

The optical signal transmission system according to an embodiment of the present invention converts the transmission loss detected by the receiving apparatus 200 into an optical signal and transmits the optical signal to the transmitting apparatus 100 through the second optical fiber. However, in FIG. 2, the second optical fiber 195 can be replaced by an electrical transmission line 193. In general, the transmission speed is higher in the optical fiber than in the electrical transmission line. Therefore, the optical transmission line is effective in transmitting channel data which must be transmitted at high speed. However, the error detection signal need not be transmitted at high speed as with the channel data. Therefore, the second optical fiber 195 for transmitting the error detection signal can be replaced by the electrical transmission line 193.

When the second optical fiber 195 of FIG. 2 is replaced by the electrical transmission line 193, the structure of the optical transmission system shown in FIG. 2 changes. Namely, the optical diode 190 for reception is not used for the transmitting apparatus 100 and the optical diode 197 for transmission is not used for the receiving apparatus 200.

Also, when the second optical fiber 195 of FIG. 2 is replaced with the electrical transmission line 193, the operation of the optical transmission system shown in FIG. 2 changes.

The error detection unit 210 of the receiving apparatus 200 detects the transmission loss caused by the first optical transmission line 185 and the optical diodes 187 for reception and encodes channel information and the detected transmission loss into serial data. Also, the error detection unit 210 transmits the encoded data to the transmitting apparatus 100 through the electrical transmission line 193 as the error detection signal. Also, the error compensating driver 160 of the transmitting apparatus 100 receives the error detection signal transmitted through the electrical transmission line 193 and controls the optical output power, corresponding to the received error detection signal.

Figure 3:
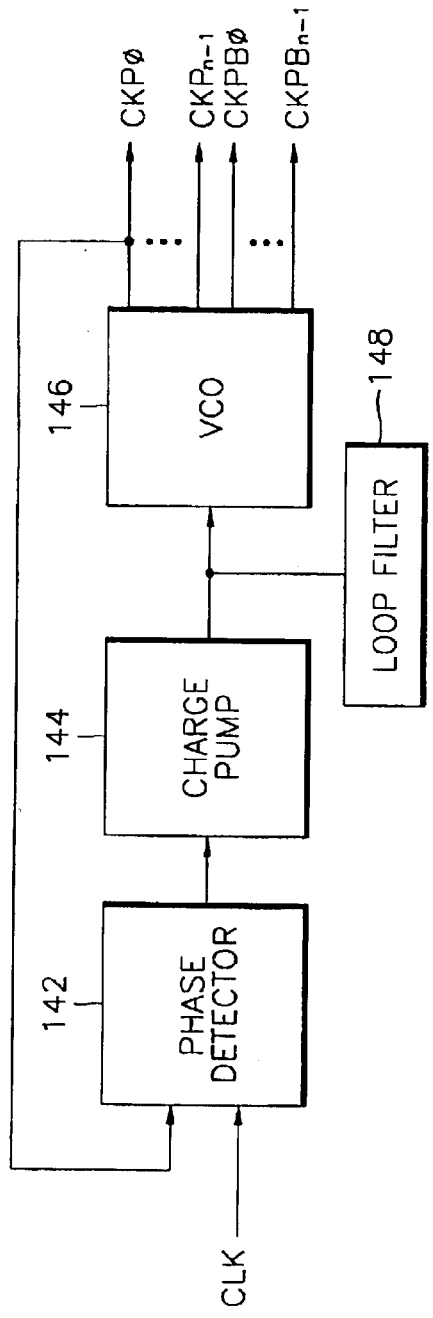
FIG. 3 is a block diagram showing a phase locked loop (PLL) 140 shown in FIG. 2.

FIG. 3 is a block diagram showing the PLL 140 shown in FIG. 2. The PLL 140 includes a phase detector 142, a charge pump 144, a loop filter 148, and a voltage controlled oscillator (VCO) 146.

Referring to FIG. 3, the phase detector 142 compares the phase of a predetermined clock signal CLK received from an external source with the phase of a first non-overlapping clock signal CKP0 generated by the VOC 146, detects the phase difference, and outputs the detection result to the charge pump 144.

The charge pump 144 supplies electric charge to the loop filter 148 or sinks electric charge from the loop filter 148, corresponding to the phase difference detected by the phase detector 142.

In general, a low-pass filter is used as the loop filter 148, which receives electric charge from the charge pump 144 or sinks electric charge to the charge pump 144. A control voltage Vc is generated by the loop filter 146 receiving electric charge from the charge pump 144 or sinking electric charge to the charge pump 144.

The VCO 146 generates a signal having an oscillation frequency corresponding to the control voltage Vc as the first synchronized clock signal PLL_CK1 synchronized with the predetermined clock signal CLK to the phase detector 142. Here, the first synchronized clock signal PLL_CK1 is the first non-overlapping clock signal CKP0. Also, the VCO 146 generates first through nth overlapping clock signals CKP0 through CKPn-1 having a predetermined offset so as not to overlap each other. Also, the VCO 146 inverts the first through nth overlapping clock signals CKP0 through CKPn-1 and generates inverted first through nth non-overlapping clock signals CKPB0 through CKPBn-1. Here, the predetermined offset can correspond to the width of a unit bit, which will be described. The VCO 146 will now be described in detail with reference to FIG. 4.

The PLL shown in FIG. 3 can be used as the PLL 260 of the receiving apparatus 200.

Figure 4:
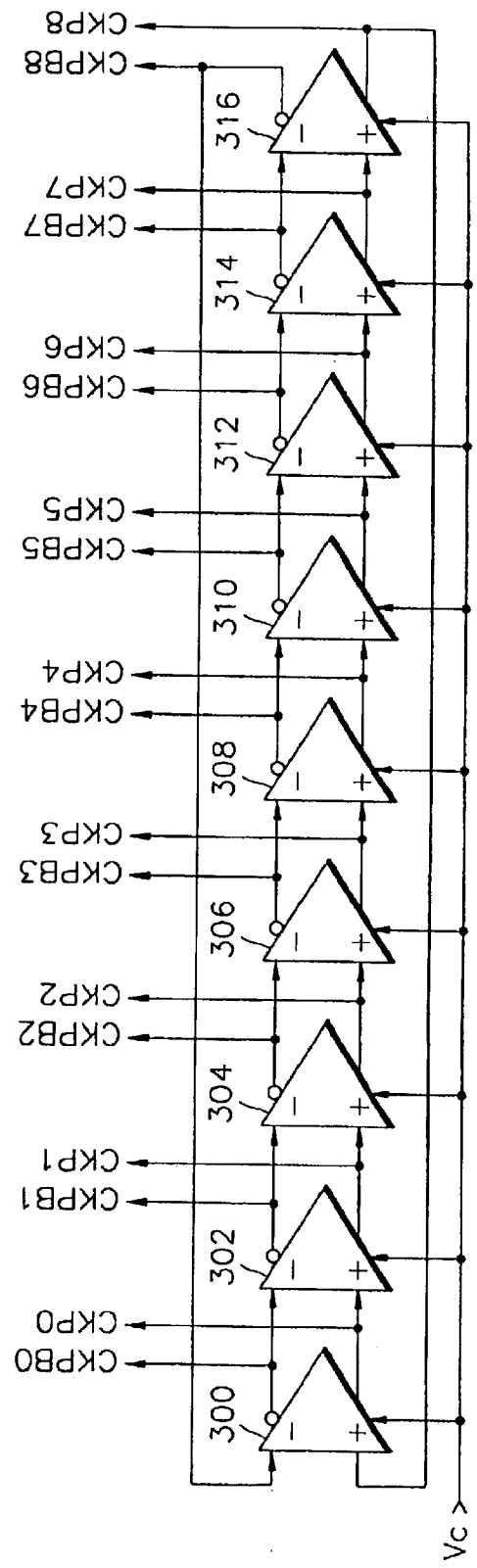
FIG. 4 is a circuit diagram showing a voltage controlled oscillator (VCO) 146 shown in FIG. 3.

FIG. 4 is a circuit diagram showing the VCO 146 shown in FIG. 3. The VCO 146 includes first through ninth delay elements 300, 302, 304 . . . , 316. Here, for convenience of explanation, the VCO 146 is mentioned to generate first through ninth overlapping clock signals CKP0 through CKP8 and inverted first through ninth non-overlapping clock signals CKPB0 through CKPB8.

Referring to FIG. 4, the VCO is formed of a ring oscillator using the nine delay elements 300, 302, 304 . . . , 316. The first through ninth non-overlapping clock signals CKP0 through CKP8 are output through the positive output terminals of the first through ninth delay elements 300 through 316. The inverted first through ninth non-overlapping clock signals CKPB0 through CKPB8 are output through the respective negative output terminals of the first through ninth delay elements 300, 302, 304 . . . , 316. In the VCO shown in FIG. 4, the frequencies of the non-overlapping clock signals CKP0 through CKPn-1 generated by the respective delay elements 300, 302, 304 . . . , 316 can change as the delay time of the delay elements 300, 302, 304 . . . , 316 changes corresponding to the control voltage VC applied to the respective delay elements 300, 302, 304 . . . , 316.

Figure 5:
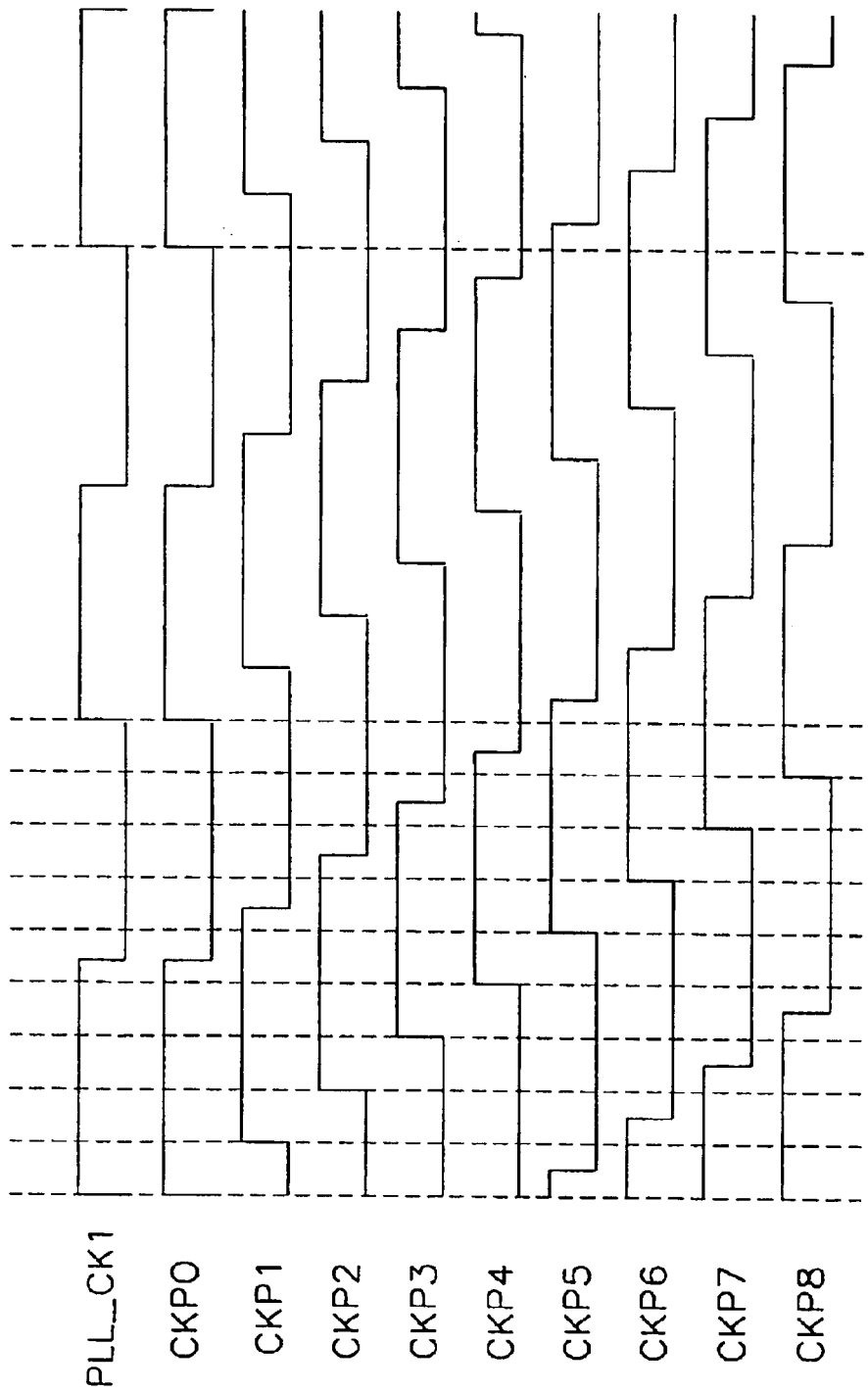
FIG. 5 shows waveforms of first through ninth non-overlapping clock signals and a first synchronized clock signal, which are output from the VCO shown in FIG. 4.

FIG. 5 shows waveforms of the first through ninth non-overlapping clock signals CKP0 through CKP8 having a predetermined offset P18 and the first synchronized clock signal PLL_CK1, which are output from the VCO shown in FIG. 4.

Figure 6:
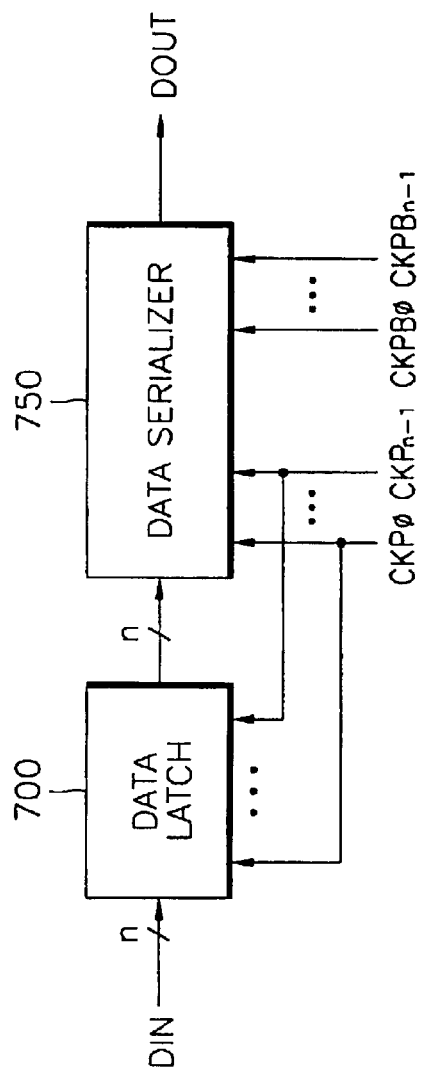
FIG. 6 is a block diagram showing the parallel/serial data converter 110 shown in FIG. 2.

FIG. 6 is a block diagram showing the parallel/serial data converter 110 shown in FIG. 2. The parallel/serial data converter 110 includes a data latch 700 and a data serializer 750.

FIGS. 7A and 7B show waveforms of the operation of the apparatus shown in FIG. 6. FIG. 7A shows the first synchronized clock signal PLL_CK1. FIG. 7B shows the serial channel data DOUT output through the data serializer 750 of FIG. 6.

Figure 7:
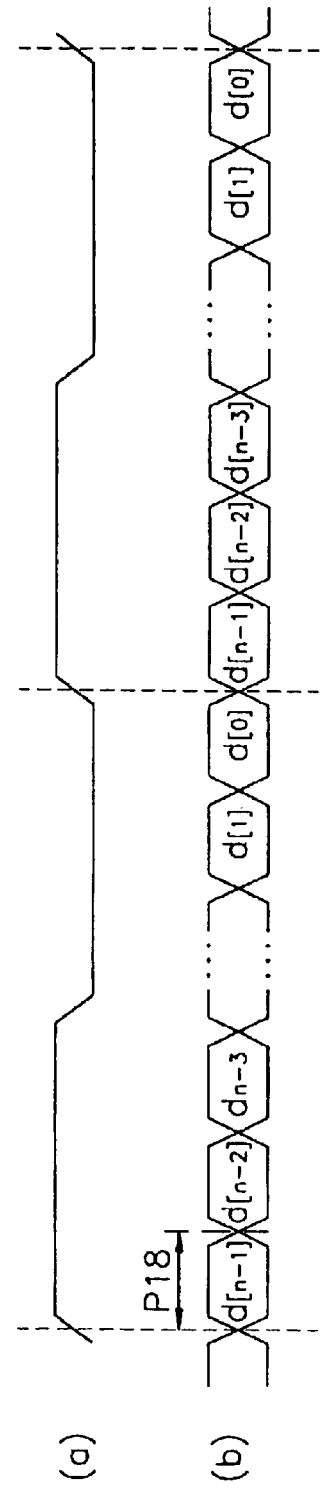
FIGS. 7A and 7B show waveforms of the operation of the apparatus shown in FIG. 6.

Referring to FIGS. 6 and 7, the data latch 700 receives n-bit channel data through an input terminal DIN, segments the n-bit channel data by N bits in response to the first through mth latch clock signals CKL0 through CKLm-1 having a timing margin corresponding to N (N is a positive integer greater than or equal to 2) unit bits among the first through nth non-overlapping clock signals CKP0 through CKPn-1 and latches the segmented channel data. Here, the first latch clock signal CKL0 is the non-overlapping clock signal having the greatest timing margin with respect to the first synchronized clock signal PLL_CK1. The reason why the first latch clock signal CKL0 is selected as the non-overlapping clock signal having the largest timing margin with respect to the first synchronized clock signal PLL_

CK1 and the detailed operation of the latch 700 will be described below with reference to FIGS. 8 and 9. In FIG. 6, the n-bit channel data input to the input terminal DIN can be the R/G/B color signals or the control signal CON.

The data serializer 750 receives the n-bit channel data latched by the data latch 700, the first through nth overlapping clock signals CKP0 through CKPn−1 and the inverted first through nth non-overlapping clock signals CKPB0 through CKPBn−1 and performs a logic operation on the received channel data and signals. Also, the data serializer 750 outputs the logic operation result as the serial channel data shown in FIG. 7B through the output terminal DOUT. Here, P18 denotes a unit bit width. The data serializer 750 will be described in detail below with reference to FIG. 10.

The apparatus shown in FIG. 6 will now be described, assuming that n is 9 and N is 3.

Figure 8:
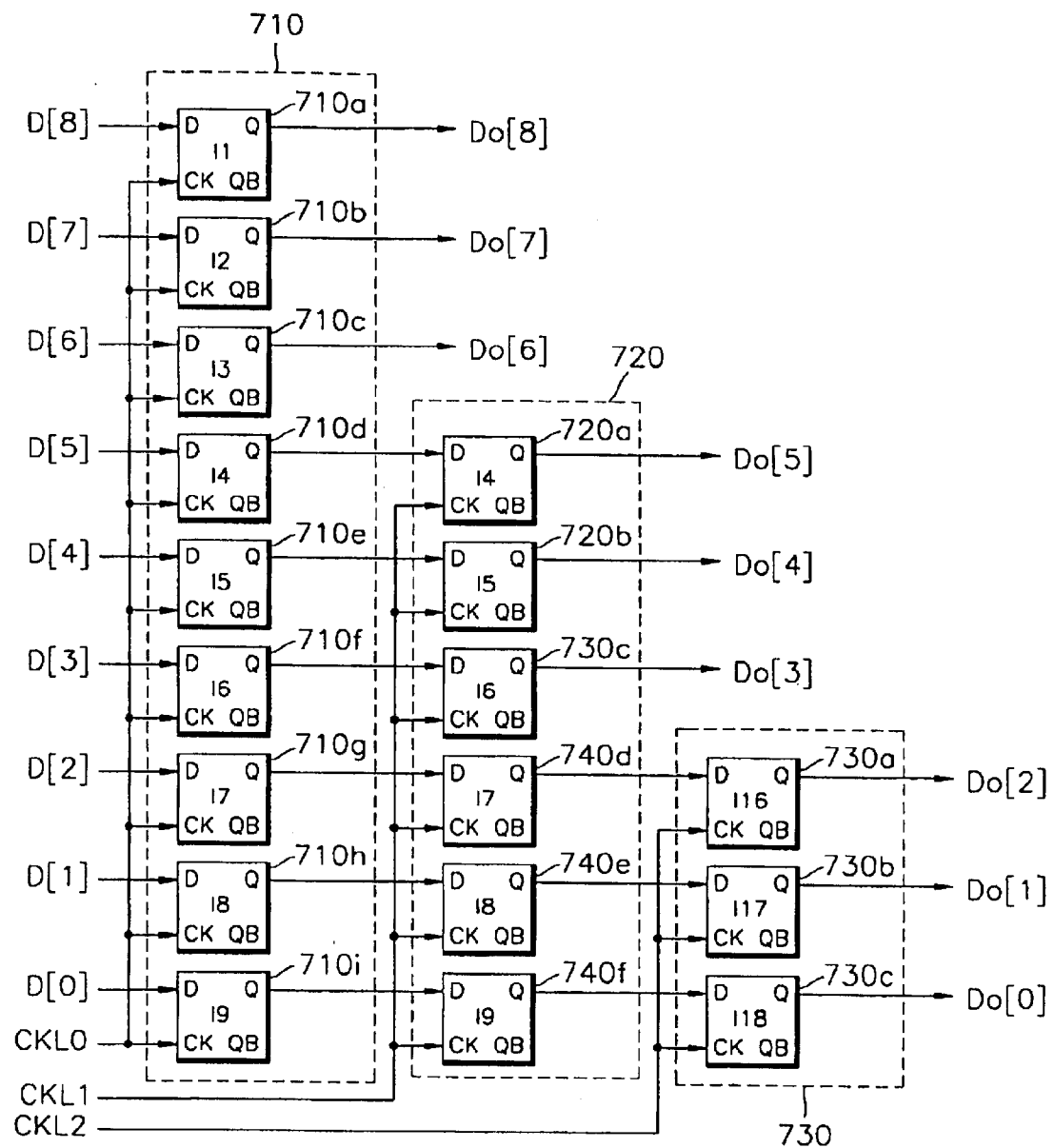
FIG. 8 is a circuit diagram showing the latch 700 shown in FIG. 6.

FIG. 8 is a circuit diagram showing the latch 700 shown in FIG. 6. The data latch 700 includes a first latch 710 including flip-flops 710a through 710i, a second latch 720 including flip-flops 720a through 720f, and a third latch 730 including flip-flops 730a through 730c.

FIGS. 9A through 9I show main waveforms in the operation of the data latch shown in FIG. 8. FIG. 9A shows the first non-overlapping clock signal CKP0. FIG. 9B denotes channel data of nine bits input to the first latch 710. FIG. 9C shows the first latch clock signal CKL1 for controlling the operation of the first latch 710. FIG. 9D shows channel data latched by the first latch 710. FIG. 9E shows a second latch clock signal CKL2 for controlling the operation of the second latch 720. FIG. 9F shows the channel data latched by the second latch 720. FIG. 9G shows a third latch clock signal CKL3 for controlling the operation of the third latch 730. FIG. 9H shows the channel data latched by the third latch 730. FIG. 9I shows the result of serializing the data latched by the data latch shown in FIG. 8 by the data serializer 750 (refer to FIG. 6).

Figure 9:
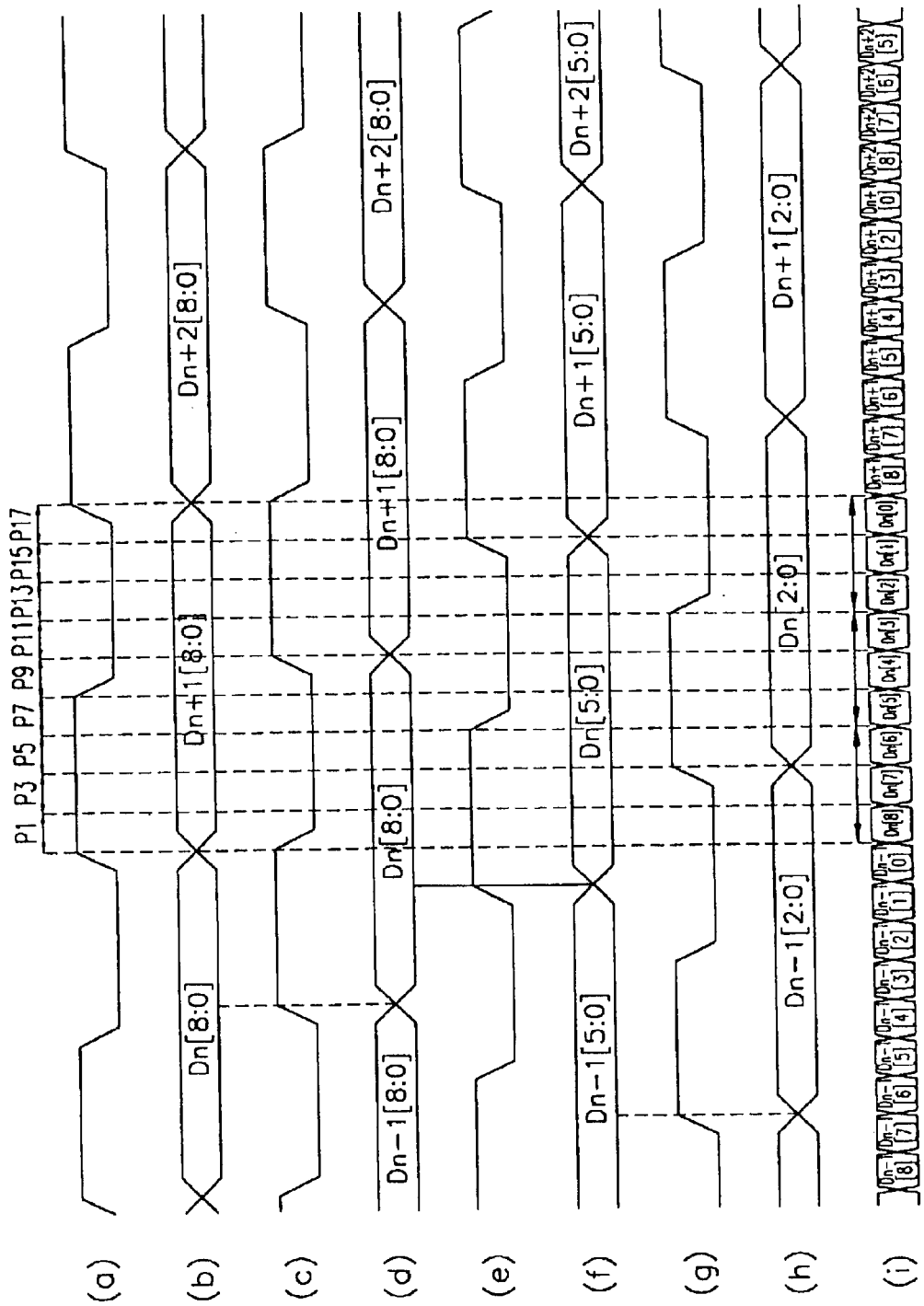
FIGS. 9A through 9I show main waveforms of operation of the data latch shown in FIG. 8.

Referring to FIGS. 8 and 9, the nine flip-flops 710a through 710i included in the first latch 710 correspond to the respective bits of the nine-bit channel data. Namely, the flip-flops 710a through 710i receive the respective bits of the channel data generated in response to the first non-overlapping clock signal CKP0 to input terminals D, as shown in FIG. 9B. Here, D[8] through D[0] denote the respective bits of the nine-bit channel data. Also, the flip-flops 710a through 710i latch input channel data in response to the first latch clock signal CKL0. As mentioned above, the first latch clock signal CKL0 has the largest timing margin with respect to the first non-overlapping clock signal CKP0 shown in FIGS. 5B and 9A among the first through ninth non-overlapping clock signals CKP0 through CKP8 (see FIG. 5). Therefore, the sixth non-overlapping clock signal CKP5 having a nearly inverted phase with respect to the phase of the first non-overlapping clock signal CKP0 can be used as the first latch clock signal CKL0. Namely, the first latch 710 latches input channel data in response to the sixth non-overlapping clock signal CKP5. Also, upper three bits of the channel data latched by the first latch 710 are latched and lower six bits are output to the second latch 720. Here, Do[8], Do[7], and Do[6] denote the upper three bits of the channel data latched by the first latch 710.

The first latch 710 can stably latch Dn[8:6] in the nine-bit channel data shown in FIG. 9B by using the sixth non-overlapping clock signal CKP5 shown in FIG. 9C as the first latch clock signal CKL0.

The six flip-flops 720a through 720f included in the second latch 720 correspond to the flip-flops 710d through 710i included in the first latch 710. Namely, the flip-flops 720a through 720f receive the data output from the flip-flops 710d through 710i to the input terminals D in response to the sixth non-overlapping clock signal CKP5, as shown in FIG. 9C. Also, the flip-flops 720a through 720f latch the input data in response to the second latch clock signal CKL1. As mentioned above, second latch clock signal CKL1 has a timing margin corresponding to three unit bits with respect to the first latch clock signal CKL0. Therefore, the sixth non-overlapping clock signal CKP5 used as the first latch clock signal CKL0 and the ninth non-overlapping clock signal CKP8 having the timing margin of three unit bits can be used as the second latch clock signal CKL1. Namely, the second latch 720 latches the input data in response to the ninth non-overlapping clock signal CKP8. The upper three bits of the channel data latched by the second latch 720 are latched and the lower three bits are output to the third latch 730. Here, Do[5], Do[4], and Do[3] denote the upper three bits of the latched data.

The second latch 720 can stably latch Dn[5:3] in the nine-bit channel data shown in FIG. 9D by using the ninth overlapping clock signal CKP8 shown in FIG. 9E as the second latch clock signal CKL1.

The three flip-flops 730a through 730c included in the third latch 730 correspond to the flip-flops 720d through 720f included in the second latch 720. Namely, the flip-flops 730a through 730c receive data output from the flip-flops 720d through 720f in response to the ninth non-overlapping clock signal CKP8 to the input terminals D, as shown in FIG. 9E. Also, the flip-flops 730a through 730c latch the input data in response to the third latch clock signal CKL2. As mentioned above, the third latch clock signal CKL2 has a timing margin corresponding to the three unit bits with respect to the second latch clock signal CKL1. Therefore, the third non-overlapping clock signal CKP2 having a timing margin of three unit bits with respect to the ninth non-overlapping clock signal CKP8 used as the second latch clock signal CKL1 can be used as the third latch clock signal CKL2. Namely, the third latch 730 latches the input data and outputs the latched data in response to the third non-overlapping clock signal CKP2. Here, Do[2], Do[1], and Do[0] denote the channel data output from the third latch 730.

The third latch 730 can stably latch Dn[2:0] in the six-bit channel data shown in FIG. 9F by using the third non-overlapping clock signal CKP2 shown in FIG. 9G as the third latch clock signal CKL2.

Figure 10:
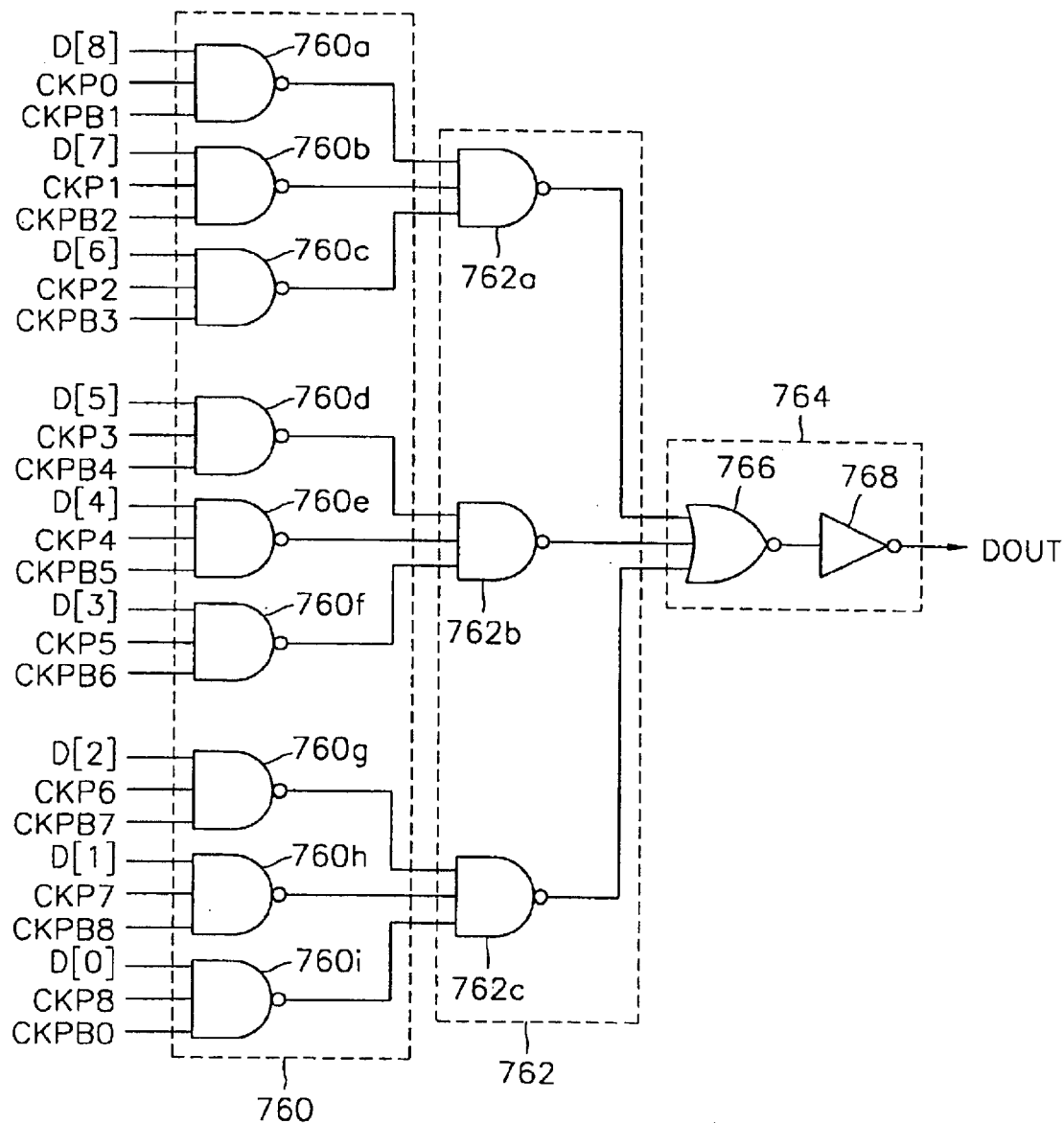
FIG. 10 is a circuit diagram showing the data serializer 750 shown in FIG. 6.

FIG. 10 is a circuit diagram showing the data serializer 750 shown in FIG. 6. The data serializer 750 includes a first logic operator 760 including NAND gates 760a through 760i, a second logic operator 762 including NAND gates 762a through 762c, and a third logic operator 764 including a NAND gate 766 and an inverter 768.

Referring to FIGS. 9 and 10, the nine NAND gates 760a through 760i included in the first logic operator 760 correspond to the respective bits of the nine-bit channel data latched by the data latch (refer to FIG. 6). Also, the NAND gates 760a through 760i correspond to the first through ninth non-overlapping clock signals CKP0 through CKP8, respectively, and the inverted second through inverted first non-overlapping clock signals CKPB2 through CKPB1, respectively. Namely, the NAND gates 760a through 760i receive the respective bits corresponding to the latched nine-bit channel data and the non-overlapping clock signals and the inverted non-overlapping clock signals corresponding thereto and perform a logic operation on the received bits and signals. For example, the NAND gate 760a receives Dn[8] which is the most significant bit (MSB) among the nine-bit channel data, the first non-overlapping clock signal CKP0, and the inverted second non-overlapping clock signal CKPB1 and performs a NAND operation on the received bit and signals. Therefore, the NAND gate 760a generates inverted channel data $\overline{Dn[8]}$ during a first period P1, where the first non-overlapping clock signal CKP0 and the inverted second non-overlapping clock signal CKPB1 are simultaneously transited to a logic high level. The remaining NAND gates 760b through 760i output data of the logic high level during the first period P1. Also, the NAND gate 760b receive Dn[7] among the nine-bit channel data, the second non-overlapping clock signal CKP1, and the inverted third non-overlapping clock signal CKPB2 and performs a NAND operation on the received bit and signals. Therefore, the NAND gate 760b generates inverted channel data $\overline{Dn[7]}$ during a second period P3, where the second non-overlapping clock signal CKP1 and the inverted third non-overlapping clock signal CKPB2 are simultaneously transited to the logic high level. The remaining NAND gates 760a and 760c through 760i output data of a logic high level during the second period P3. The NAND gate 760c through 760i output inverted channel data $\overline{Dn[6]}$ through $\overline{Dn[0]}$ during third through ninth periods P5 through P9.

The NAND gate 762a of the second logic operator 762 performs a NAND operation on the data output from the NAND gates 760a through 760c. The NAND gate 762b performs a NAND operation on the data output from the NAND gates 760d through 760f. The NAND gate 762c performs a NAND operation on the data output from the NAND gates 760g through 760i.

The NOR gate 766 of the third logic operator 764 receives the data on which a NAND operation is performed by the NAND gates 762a through 762c and performs a NOR operation on the data. The inverter 768 inverts the data on which a NOR operation is performed by the NOR gate 766 and outputs the inversion result through the output terminal DOUT as the serial channel data. The serial channel data shown in FIG. 9I is output to the output terminal DOUT.

Referring to FIGS. 8, 9, and 10, the data serializer shown in FIG. 10 serializes the upper three bits, Dn[8], Dn[7], and Dn[6] among the channel data Dn[8:0] shown in FIG. 9D and outputs the serialized upper three bits, during the first through third periods P1 through P3. Namely, the upper three bits can be stably serialized in the center of the channel data Dn[8:0] shown in FIG. 9D. The data serializer shown in FIG. 10 serializes the channel data Dn[2:0] shown in FIG. 9H and outputs the serialized channel data during seventh through ninth periods P13 through P17. Namely, the three lower bits can be stably serialized in the center of the channel data Dn[2:0] shown in FIG. 9H.

It is assumed that the data latch shown in FIG. 8 latches the nine-bit channel data by a general method, in which the first synchronized clock signal PLL_CK1 is used, without segmenting and latching the nine-bit channel data. The data serializer shown in FIG. 10 outputs the MSB Dn[8] of the channel data shown in FIG. 9B as the serial channel data in the first period P1. Also, the data serializer shown in FIG. 10 outputs the least significant bit (LSB) Dn[0] of the channel data shown in FIG. 9B as the serial channel data in the ninth period P8. At this time, the data serializer can output incorrect serial channel data even when a slight phase difference exists between the first synchronized clock signal PLL_CK1 shown in FIG. 9A and the nine-bit channel data shown in FIG. 9B. Namely, the data serializer shown in FIG. 10 can output the LSB Dn−1[0] of the previous channel data at a point in time where the MSB Dn[8] must be output as the serial channel data. Also, the data serializer can output the MSB Dn+1[8] of the next channel data at the point in time where the LSB Dn[0] must be output as the serial channel data. As a result, the LSB of the previous channel data or the MSB of the next channel data can be mixed at the boundary of the channel data.

However, since the data latch shown in FIG. 9 segments and latches the nine-bit channel data using the sixth, ninth, and third overlapping clock signals CKP5, CKP8, and CKP2, the data serializer shown in FIG. 10 can stably serialize the nine-bit channel data in the center of the parallel channel data.

Since the data serializer shown in FIG. 10 is realized only by gates gated for a short time, a high-speed serializer of a level greater than the GHz level can be realized and the size of a circuit can be significantly reduced compared with the circuit in the conventional general data serializer realized by flip-flops. Also, since the data serializer shown in FIG. 10 serializes data using the non-overlapping clock signals CKP whose frequencies are lower than the frequencies of the conventional data serializer, it is possible to reduce power consumption. For example, the conventional data serializer serializes data using a clock signal multiplied by the number of bits of the parallel data.

Figure 11:
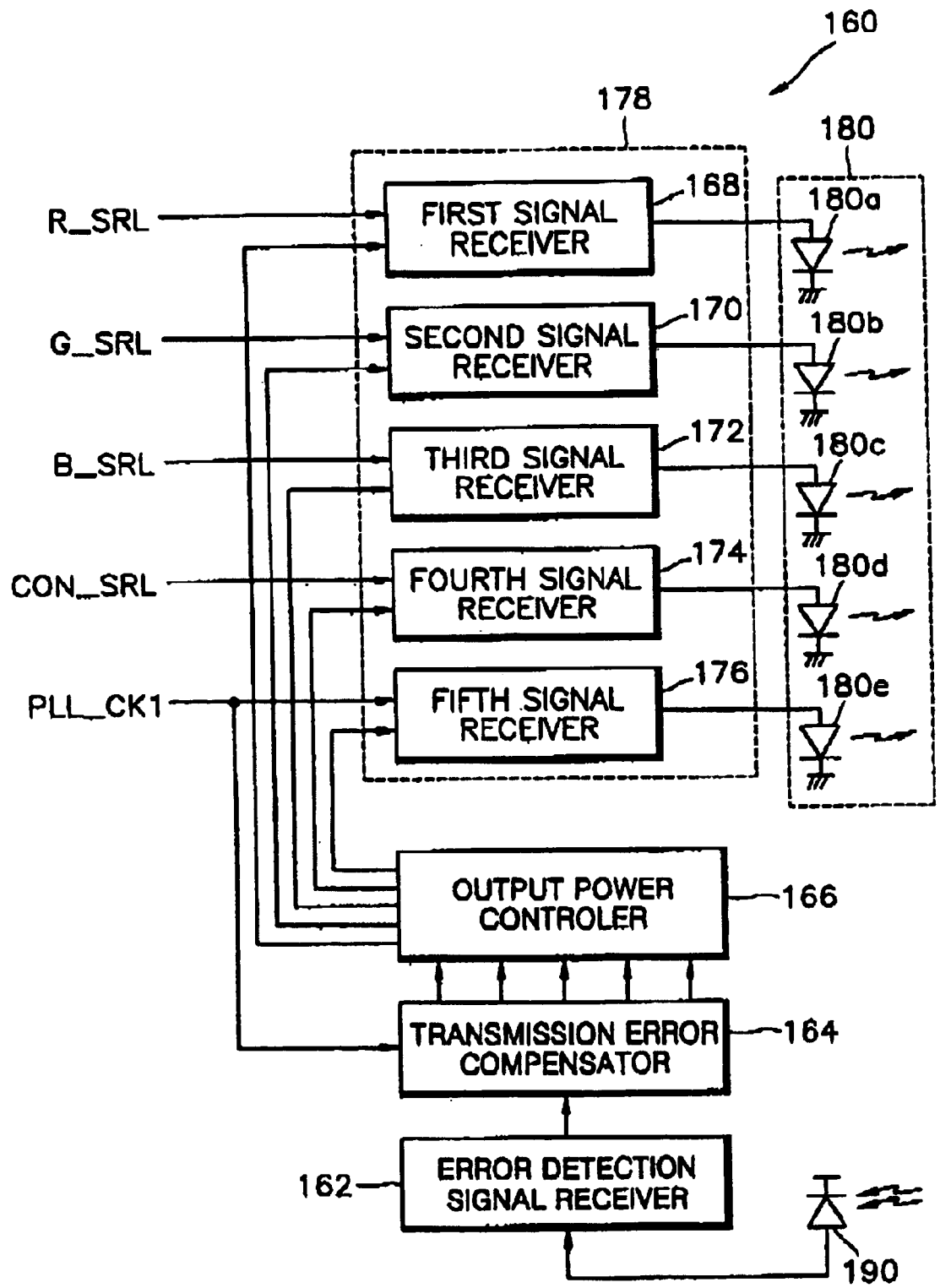
FIG. 11 is a block diagram showing the error compensating driver 160 shown in FIG. 2.

FIG. 11 is a block diagram showing the error compensating driver 160 shown in FIG. 2. The error compensating driver 160 includes first through fifth signal drivers 168 through 176, an output controller 166, a transmission error compensator 164, and an error detection receiver 162. Also, in FIG. 11, optical diodes for transmission 180a through 180e and an optical diode for reception 190 are shown together for convenience of explanation. In FIG. 11, R_SRL, G_SRL, B_SRL, and CON_SRL denote the serial channel data output from the parallel/serial data converter 110 shown in FIG. 2. PLL_CK1 denotes the first synchronized clock signal output from the PLL 140 shown in FIG. 2.

Referring to FIG. 11, the optical diode for reception 190 receives an error detection signal, which is converted into an optical signal and transmitted by the receiving apparatus 200 (refer to FIG. 2) to the tranmitting apparatus and converts the received error detection signal into current. As mentioned above, channel information and information on the transmission loss detected in each channel are included in the error detection signal.

The error detection receiver 162 receives the signal converted into current from the optical diode for reception 190 and converts the received signal into a voltage. Also, error detection receiver 162 digitizes the converted voltage signal and outputs the digitized signal to the transmission error compensator 164 as an error compensating signal.

The transmission error compensator 164 decodes the error compensation signal output from the error detection receiver 162 in response to the first synchronized clock signal PLL_CK1. Namely, the transmission error compensator 164 decodes the error compensation signal and recovers the transmission loss data in each channel, which is detected by the receiving apparatus 200 (see FIG. 2). The transmission error compensator 164 analog converts the recovered transmission loss data. The analog converted signal is output to the optical output controller 166 as the transmission loss compensation signal for compensating for transmission loss generated in each channel. The transmission error compensator 164 will be described in detail below with reference to FIG. 12.

The optical output controller 166 receives the transmission error compensation signals generated by the transmission error compensator 164, generates optical output control signals corresponding to the transmission loss compensation signals, and outputs the optical output control signals to the first through fifth signal drivers 168, 170, 172, 174 and 176. Here, the optical output control signals are control signals for controlling the modulation current or the bias current of the first through fifth signal drivers 168, 170, 172, 174 and 176. The modulation current is for changing the swing range of an actually transmitted optical signal. The bias current is for controlling the direct current (DC) level of the output optical signal. The bias current is set at the on/off boundary of the optical diode for transmission and prevents the transmission speed of data from deteriorating according to whether the optical diode for transmission is turned on/off.

The first through fifth signal drivers 168, 170, 172, 174 and 176 convert the serial channel data received to each channel into current signals. Also, the first through fifth signal drivers 168, 170, 172, 174 and 176 change the magnitude of the bias current or the modulation current in response to the optical output control signal output from the optical output controller 166. Here, whether the first through fifth signal drivers 168, 170, 172, 174 and 176 change the bias current or the modulation current in response to the optical output control signal is determined by the error detection signal transmitted from the receiving apparatus 200 (see FIG. 2). Also, the first through fifth signal drivers 168, 170, 172, 174 and 176 add the converted current signal, the bias current, and the modulation current to each other and outputs the addition result as a driving signal for driving the corresponding optical diodes 180*a* through 180*e* for transmission.

The optical diodes 180*a* through 180*e* for transmission generate an optical signal having an optical output power corresponding to the driving signal output from the first through fifth signal drivers 168, 170, 172, 174 and 176.

The driving signals for driving the optical diodes 180*a* through 180*e* for transmission change corresponding to the error detection signal detected by the receiving apparatus. Transmission loss generated during transmission from the transmitting apparatus to the receiving apparatus is compensated in the optical signal output from the optical diodes 180*a* through 180*e* for transmission.

In FIG. 2, when the second optical fiber 195 is replaced by the electrical transmission line 193, the structure of the error compensating driver shown in FIG. 11 changes. Namely, in FIG. 2, when the second optical fiber 195 is replaced by the electrical transmission line 193, the error detection receiver 162 is not used for the error compensating driver. In the error compensating driver, the error detection signal transmitted from the electrical transmission line 193 is directly received by the transmission error compensator 164. After the transmission error compensator 164 receives the error detection signal from the electrical transmission line 193, the operations of the transmission error compensator 164, the optical output power controller 166, and the first through fifth signal drivers 168 through 176 were described above with reference to FIG. 11.

Figure 12:
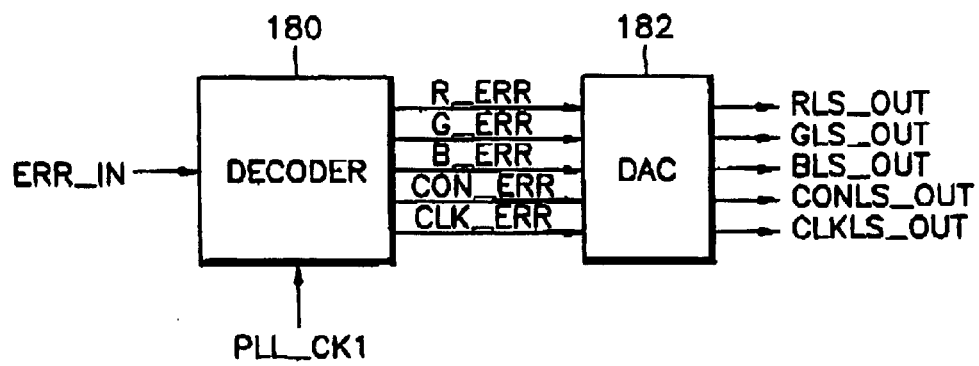
FIG. 12 is a block diagram showing the transmission error compensator 164 shown in FIG. 11.

FIG. 12 is a block diagram showing the transmission error compensator 164 shown in FIG. 11. The transmission error compensator 164 includes a decoder and a digital-to-analog converter (DAC) 182.

Referring to FIG. 12, the decoder 180 decodes the error compensation signal output from the error detection receiver 162 (see FIG. 11) in response to the first synchronized clock signal PLL_CK1. The decoding result is output to the DAC 182 as the transmission loss data generated when each channel data is transmitted. In FIG. 12, ERR_IN denotes the error compensation signal output from the error detection receiver 162. R_ERR, G_ERR, and B_ERR denote the transmission error data detected by the channel, to which the R/G/B color signals are transmitted. CON_ERR and CLK_ERR denote the transmission loss data detected by the channel, to which the control signal CON and the clock signal CLK are transmitted.

The DAC 182 converts the transmission loss data output from the decoder 180 into analog signals as the transmission loss compensating signals for compensating for loss in each channel. In FIG. 12, RLS_OUT, GLS_OUT, and BLS_OUT denote transmission loss compensation signals for compensating for the transmission loss of each of the R/G/B color signals. CONLS_OUT and CLKLS_OUT denote transmission loss compensation signals for compensating for the transmission loss of the control signal CON and the clock signal CLK.

Figure 13:
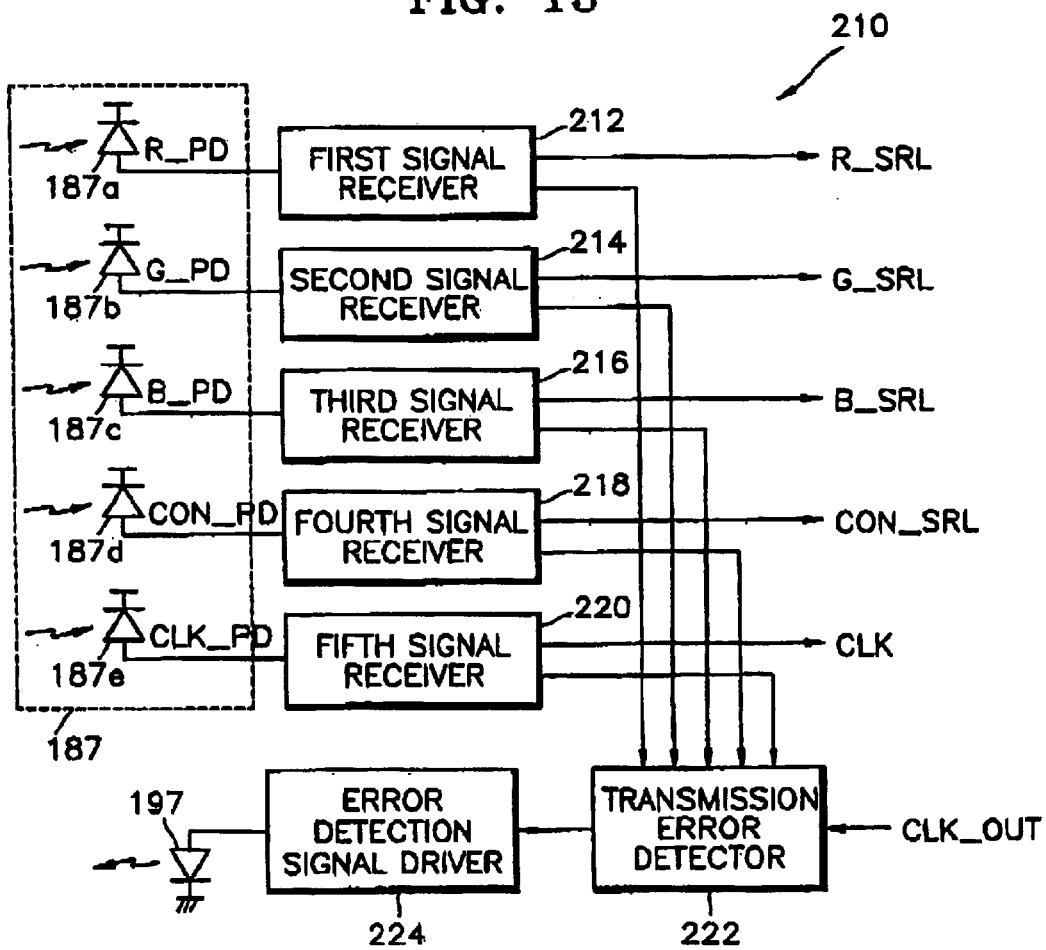
FIG. 13 is a block diagram showing the error detection unit 210 shown in FIG. 2.

FIG. 13 is a block diagram showing the error detection unit 210 shown in FIG. 2. The error detection unit 210 includes first through fifth signal receivers 212, 214, 216, 218 and 220, an error detection signal driver 224, and a transmission error detector 222. Also, in FIG. 13, the optical diodes 187*a* through 187*e* for reception and the optical diode 197 for transmission are shown together for convenience of explanation.

Referring to FIG. 13, the optical diodes 187*a* through 187*e* for reception receive the channel data converted into the optical signals through the first optical fiber 185 (see FIG. 2). The optical diodes 187*a* through 187*e* for transmission convert the received optical signals into current signals and output the current signals.

The first through fifth signal receivers 212, 214, 216, 218 and 220 convert the current signals received from the optical diodes 187*a* through 187*e* for reception into voltage signals and the converted voltage signals to the transmission error detector 222. At this time, the voltage signals output from the first through fifth signal receivers 212, 214, 216, 218 and 220 are voltage signal pairs whose phases are inverted from each other. Also, the first through fifth signal receivers 212, 214, 216, 218 and 220 convert the levels of the converted voltage signals and output the digitalized signals as the recovered serial channel data and the recovered clock signal. In FIG. 13, R_REC, G_REC, B_REC, and CON_REC denote the recovered serial channel data and CLK_REC denotes the recovered clock signal.

The transmission error detector 222 receive the converted voltage signal pairs from the first through fifth signal receivers 212, 214, 216, 218 and 220 and detect the transmission loss in each channel using the voltage signal pairs. Here, two methods are used for obtaining transmission loss in each channel. In the first method, the transmission loss detector 222 selects one voltage signal among the voltage signal pairs and obtains the transmission loss by detecting the amplitude of the selected voltage signal. For example, when the optical transmission system keeps the transmission efficiency uniform, the level of the voltage signal converted by the first through fifth signal receivers 212, 214, 216, 218 and 220 will kept a predetermined reference level. However, when the transmission efficiency changes due to the characteristics of the first optical fiber 185 and the receiving apparatus 200 and thus, transmission loss is generated, the level of the voltage signal converted by the first through fifth signal receivers 212, 214, 216, 218 and 220 deviates from a first predetermined reference level. The transmission error detector 222 detects the level of the converted voltage level and compares the level of the detected voltage signal with the first predetermined level. Accordingly, transmission loss is detected. The transmitting apparatus 100 (see FIG. 2) controls the modulation current, corresponding to the detected transmission error. Therefore, the level of the voltage signal converted by the first through fifth signal receivers 212, 214, 216, 218 and 220 of the receiving apparatus (see FIG. 2) 200 is kept at the first predetermined reference level.

In the second method, the average levels of each of the voltage signal pairs are obtained and the transmission error is obtained using the difference between the average levels. When transmission loss is not generated, the difference between the average levels will be kept at a predetermined second reference level. However, when transmission loss is generated, the difference between the average levels will deviate from the second reference level. The transmission error detector 222 can detect transmission loss by comparing the difference between the average levels of each of the voltage signal pairs with the second reference level. Also, the transmitting apparatus 200 controls the bias current, corresponding to the detected transmission loss. Therefore, the difference between the average levels of each of the voltage signal pairs converted by the first through fifth signal receivers 212 through 220 can be kept at the second reference level.

Also, the transmission error detector 222 encodes the obtained transmission loss of each channel as transmission loss data having channel information and transmission loss information in response to the second synchronized clock signal CLK_OUT and outputs the encoded transmission loss. The transmission error detector 222 will be described in detail below with reference to FIGS. 14 and 15.

The optical driver 224 receives the transmission loss data output from the transmission error detector 222 and converts the received transmission loss data into a current signal and outputs the converted direct signal as a driving signal for driving the optical diode 197 for transmission.

The optical diode 197 transmission converts the direct signal converted by the optical driver 224 into an optical signal and outputs the converted optical signal as an error detection signal.

In FIG. 2, when the second optical fiber 195 is replaced by the electrical transmission line 193, the structure of the error detection receiver shown in FIG. 13 changes. Namely, in FIG. 2, when the second optical fiber 195 is replaced with the electrical transmission line 193, the error detection signal driver 224 is not used for the error detection unit. Namely, the transmission error detector 222 of the error detection unit outputs encoded data as an error detection signal and the error detection signal is transmitted to the transmitting apparatus 100 through the electrical transmission line 193.

Figure 14:
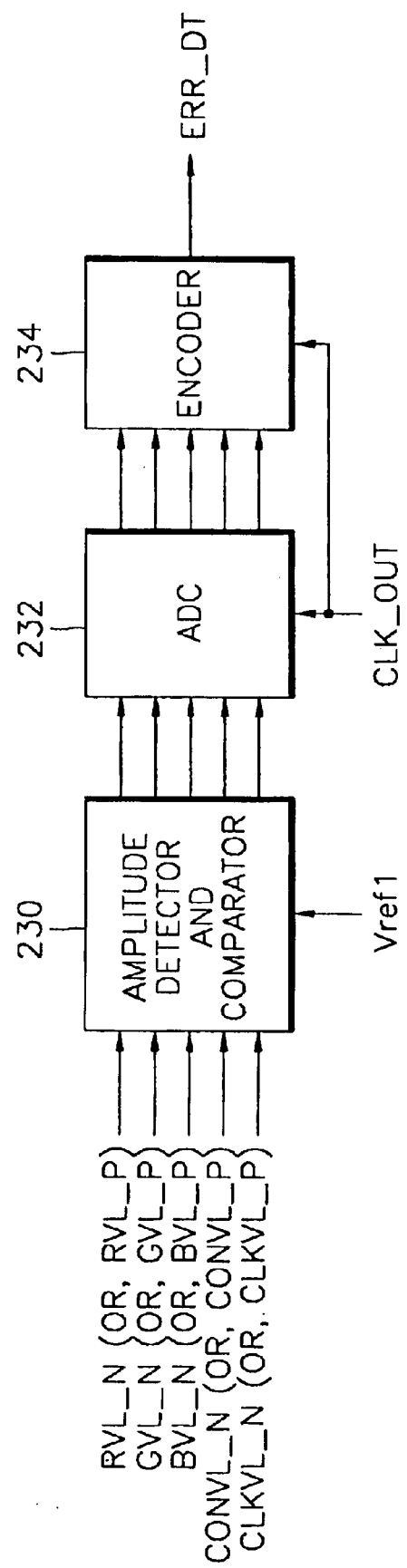
FIG. 14 is a block diagram showing an embodiment of the transmission error detector 222 shown in FIG. 13.

FIG. 14 is a block diagram showing an embodiment of the transmission error detector 222 shown in FIG. 13. The transmission error detector 222 includes an amplitude detector and comparator 230, an analog-to-digital converter (ADC) 232, and an encoder 234.

Referring to FIG. 14, the amplitude detector and comparator 230 selects one voltage signal among the voltage signal pairs output from the first through fifth signal receivers 212, 214, 216, 218 and 220 (see FIG. 13) and detects the amplitude of the voltage signal. In FIG. 14, RVL_P/RVL_N, GVL_P/GVL_N, and BVL_P/BVL_N denote the voltage signal pairs generated by the first through third optical receivers 212, 214 and 216. CONVL_P/CONVL_N and CLKVL_P/CLKVL_N denote the voltage signal pairs generated by the fourth and fifth signal receivers 218 and 220. Also, the amplitude detector and comparator 230 compares the detected amplitude with a first reference voltage $V_{ref1}$ and outputs the comparison result as the detected transmission loss to the ADC 232.

The ADC 232 receives transmission losses of each channel from the amplitude detector and comparator 230 and converts the received transmission losses of each channel into digital signals in response to the second synchronized clock signal CLK_OUT and outputs the converted transmission loss in digital form.

The encoder 234 receives the digital signals output from the ADC 232 to each channel in response to the second synchronized clock signal CLK_OUT and encodes the digital signals to digital signals having channel information and error information. Also, the encoder 234 outputs encoded data to the error detection signal driver 224 (see FIG. 13) as error detection data. In FIG. 14, ERR_DT denotes the error detection data output from the encoder 234.

Figure 15:
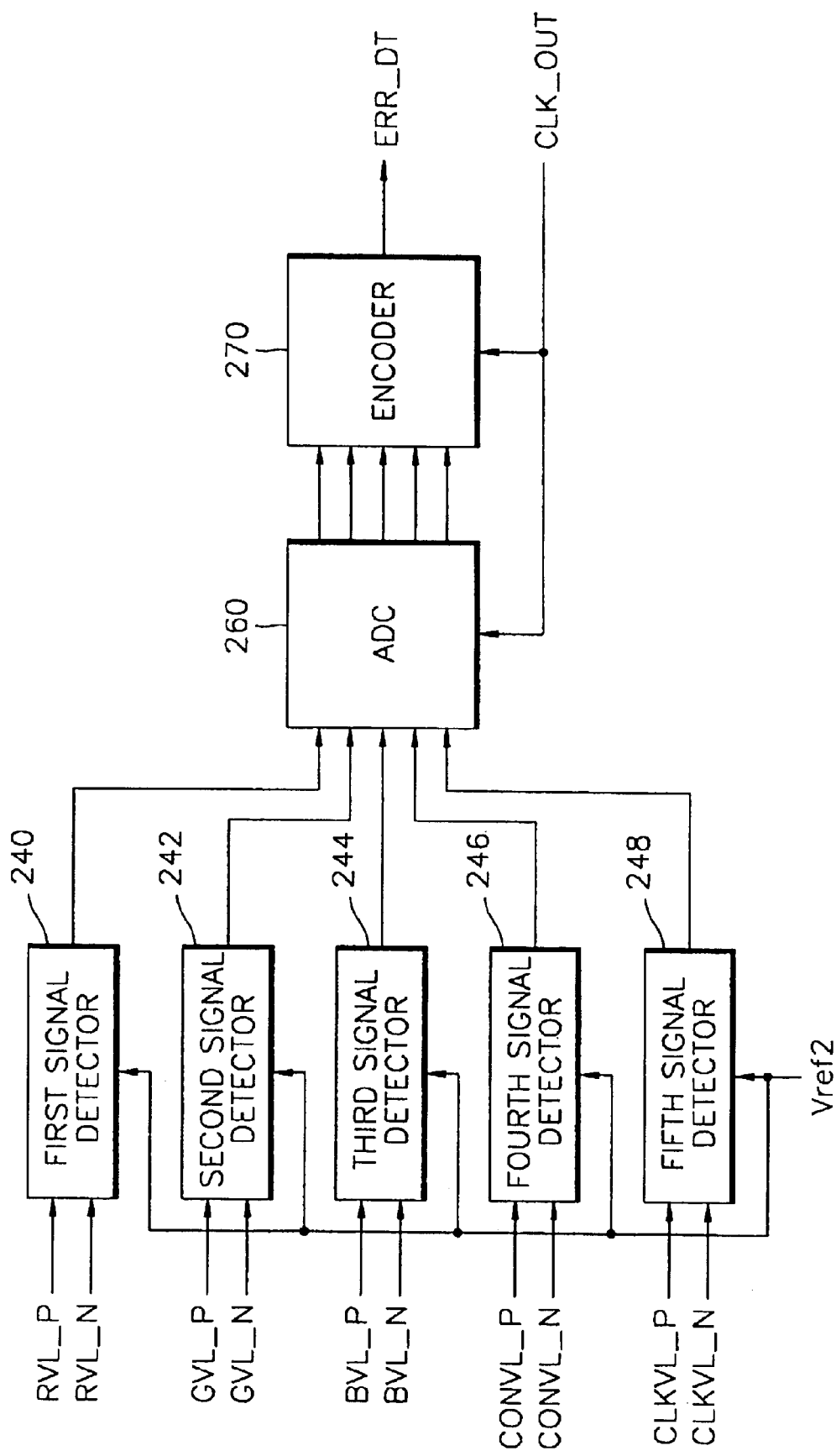
FIG. 15 is a block diagram showing another embodiment of the transmission error detector 222 shown in FIG. 13.

FIG. 15 is a block diagram showing another embodiment of the transmission error detector 222 shown in FIG. 13. The transmission error detector 222 includes first through fifth signal detectors and comparators 240, 242, 244, 246 and 248, an ADC 260, and an encoder 270.

Referring to FIG. 15, the first signal detector and comparator 240 receives the voltage signal pairs RVL_P and RVL_N output from the first optical receiver 212 (refer to FIG. 13) and obtains the difference between the average levels of each of the received voltage signal pairs. Also, the first signal detector and comparator 240 compares the difference between the average levels with a second reference voltage Vref2 and outputs the comparison result as the transmission loss to the ADC 260. Since the second through fifth signal detectors and comparators 242 and 248 perform the same operations as the operation performed by the first signal detector and comparator 240, detailed descriptions thereof will be omitted.

The ADC 260 receive the transmission loss output from the first through fifth signal detectors and comparators 240, 242, 244, 246 and 248 and digitally converts the received transmission loss in response to the second synchronized clock signal CLK_OUT, and outputs the converted transmission loss in digital form.

The encoder 270 receives the digital signals output from the each channel of the ADC 260 and encodes the received digital signals to a digital signal having channel information and error information in response to the second synchronized clock signal CLK_OUT. Also, the encoder 234 outputs the encoded data as error detection data ERR_DT to the error detection signal driver 224 (see FIG. 13).

While this invention has been particularly shown and described with reference to preferred embodiments thereof, it will be understood by those skilled in the art that various changes in form and details may be made therein without departing from the spirit and scope of the invention as defined by the appended claims.

In the optical transmission system for compensating for transmission loss according to the present invention, the receiving apparatus detects transmission loss and transmits the detected transmission loss to the transmitting apparatus and the transmitting apparatus controls the optical output power, corresponding to the transmission loss transmitted from the receiving apparatus. Accordingly, it is possible to keep the optical efficiency uniform without the need for external control. Therefore, since a standard device, where the error allowance range is large, can be used, it is possible to reduce costs. Also, because the parallel/serial data converter is realized in a gate-oriented configuration, it is possible to convert data at high speeds greater than the GHz level and to reduce the size of the circuit. Also, it is possible to reduce power consumption since the non-overlapping clock signals whose frequencies are relatively low are used even when data is converted at high speeds greater than the GHz level.

What is claimed is:

1. An optical transmission system for compensating for transmission loss, comprising:

a transmitting apparatus for serializing a plurality of n-bit channel data, where n is a natural number, received from an external source, in response to a predetermined clock signal, converting the serialized channel data into a first current signal and converting the predetermined clock signal into a second current signal, the magnitudes of the first current signal and second current signal being modulated in accordance with corresponding first and second transmission loss compensation signals decoded from an error detection signal received from a remote receiving apparatus, and outputting first and second optical signals having respective first and second optical output power levels corresponding to the respective magnitudes of the first and second current signals;

first and second transmission optical fibers for transmitting the first and second optical signals;

a receiving apparatus for recovering the n-bit channel data and the predetermined clock signal from the first and second optical signals received through the first and second transmission optical fibers, detecting first and second transmission loss in each of the first and second optical signals as a result of their transmission and reception to generate first and second transmission loss signals, encoding the first and second transmission loss signals to generate an encoded transmission loss signal, and optically converting the encoded transmission loss signal as the error detection signal; and a return optical fiber for transmitting the error detection signal to the transmitting apparatus.

2. The optical transmission system of claim 1, wherein the transmitting apparatus comprises:

a first phase locked loop (PLL) for generating a clock signal synchronized with the predetermined clock signal as a first synchronized clock signal;

a parallel/serial data converter for receiving the plurality of n-bit channel data in response to the first synchronized clock signal and serializing the n-bit channel data in response to the first synchronized clock signal to provide the serialized n-bit channel data;

a receiver optical diode for receiving and converting the error detection signal transmitted from the return optical fiber into an error detection current signal;

an error compensating driver for converting the serialized n-bit channel data and the first synchronized clock signal into the first and second current signals respectively, converting the error detection current signal into a digital error compensation signal, decoding the first and second transmission loss compensation signals from the digital error compensation signal, modulating the magnitudes of the first and second current signals in accordance with the corresponding first and second transmission loss compensation signals, and outputting the modulated first and second current signals as first and second driving signals; and first and second transmitting optical diodes for outputting the first and second optical signals having optical output powers corresponding to the first and second driving signals.

3. The optical transmission system of claim 2, wherein the parallel/serial data converter comprises:

a data latch for receiving the n-bit channel data and segmenting and latching the n-bit channel data by N (N is a natural number) bits in response to first through m (m is a natural number) th latch clock signals; and a data serializer for performing a logic operation on the n-bit channel data latched by the data latch, first through nth non-overlapping clock signals, and inverted first through nth non-overlapping clock signals and outputting the logic operation result as the serialized channel data, wherein the first through nth non-overlapping clock signals are generated by the phase locked loop (PLL) and have a predetermined offset so as not to overlap each other.

4. The optical transmission system of claim 2, wherein the error compensating driver comprises:

an error detection receiver for receiving the error detection current signal and converting the received error detection current signal into a digitized error compensation signal;

a transmission error compensator for recovering first and second transmission loss data signals corresponding to the transmission loss occurring in the transmission of the first and second optical signals from the error compensation signal in response to the first synchronized clock signal, analog converting the recovered first and second transmission loss data signals to provide the first and second transmission loss compensation signals; and a plurality of signal drivers for converting the serialized n-bit channel data and the first synchronized clock signal into the first and second current signals, modulating the magnitudes of the converted first and second current signals in response to the corresponding first and second transmission loss compensation signals, and outputting the modulated first and second current signals as the first and second driving signals.

5. The optical transmission system of claim 1, wherein the receiving apparatus comprises:

first and second optical receiver diodes for receiving optical signals transmitted through the first and second transmission optical fibers and converting the received optical signals into received current signals;

an error detection unit for converting the received current signals converted by the first and second optical receiver diodes into voltage signals, digitizing the voltage signals into digital signals, and providing the digital signals as received serial n-bit channel data and a recovered clock signal, detecting transmission loss in the received signals from the voltage signals as the first and second transmission loss signals, encoding the first and second transmission loss signals as the encoded transmission loss signal, and converting the encoded transmission loss signal into an encoded transmission loss current signal;

a second PLL for generating a second synchronized clock signal synchronized with the recovered clock signal;

a data recovery unit for recovering the received recovered serial n-bit channel data to n-bit parallel data in response to the second synchronized clock signal; and an optical feedback diode for transmission for optically transmitting the error detection signal to the transmitting apparatus via the return optical fiber in response to the encoded transmission loss current signal.

6. The optical transmission system of claim 5, wherein the error detection unit comprises:

first and second signal receivers for converting the current signals converted by the plurality of first and second optical receiver diodes into voltage signals, outputting the voltage signals, digitizing the voltage signals into the digital signals, and providing the digital signals as the received serial n-bit channel data and the recovered clock signal;

a transmission error detector for detecting the transmission loss in the received signals from the voltage signals, and encoding the first and second transmission loss signals in response to the second synchronized clock signal; and an error detection signal driver for receiving the encoded transmission loss signal, converting the encoded transmission loss signal into the encoded transmission loss current signal, and providing the encoded transmission loss current signal to the optical feedback diode for transmission.

7. An optical transmission system for compensating for transmission loss, comprising:

a transmitting apparatus for serializing a plurality of n-bit channel data received from an external source, in response to a predetermined clock signal, converting the serialized channel data into a first current signal and converting the predetermined clock signal into a second current signal, the magnitudes of the first current signal and second current signal being modulated in accordance with corresponding first and second transmission loss compensation signals decoded from an error detection signal received from a remote receiving apparatus, and outputting first and second optical signals having respective first and second optical output power levels corresponding to the respective magnitudes of the first and second current signals;

first and second transmission optical fibers for transmitting the first and second optical signals;

a receiving apparatus for recovering the n-bit channel data and the predetermined clock signal from the first and second optical signals received through the first and second transmission optical fibers, detecting first and second transmission loss in each of the first and second optical signals as a result of their transmission and reception to generate first and second transmission loss signals, and encoding the first and second transmission loss signals to generate an encoded transmission loss signal as the error detection signal; and an electrical transmission line for transmitting the error detection signal to the transmitting apparatus.

8. The optical transmission system of claim 7, wherein the transmitting apparatus comprises:

a first phase locked loop (PLL) for generating a clock signal synchronized with the predetermined clock signal as a first synchronized clock signal;

a parallel/serial data converter for receiving the plurality of n-bit channel data in response to the first synchronized clock signal and serializing the n-bit channel data in response to the first synchronized clock signal, to provide the serialized n-bit channel data;

an error compensating driver for converting the serialized n-bit channel data and the first synchronized clock signal into the first and second current signals respectively, converting the error detection current signal into a digital error compensation signal, decoding the first and second transmission loss compensation signals from the digital error compensation signal, modulating the magnitudes of the first and second current signals in accordance with the corresponding first and second transmission loss compensation signals, and outputting the modulated first and second current signals as first and second driving signals; and first and second transmitting optical diodes for outputting the first and second optical signals having optical output powers corresponding to the first and second driving signals.

9. The optical transmission system of claim 8, wherein the error compensating driver comprises:

a transmission error compensator for recovering first and second transmission loss data signals corresponding to the transmission loss occurring in the transmission of the first and second optical signals from the error detection signal in response to the first synchronized clock signal, analog converting the recovered first and second transmission loss data signals, to provide the first and second transmission loss compensation signals; and a plurality of signal drivers for converting the serialized n-bit channel data and the first synchronized clock signal into the first and second current signals, modulating the magnitudes of the converted first and second current signals in response to the first and second transmission loss compensation signals, and outputting the modulated first and second current signals as the first and second driving signals.

10. The optical transmission system of claim 7, wherein the receiving apparatus comprises:

first and second optical receiver diodes for receiving optical signals transmitted through the first and second transmission optical fibers and converting the received optical signals into received current signals;

an error detection unit for converting the received current signals converted by the first and second optical receiver diodes into voltage signals, digitizing the voltage signals into digital signals, and providing the digital signals as received, serial n-bit channel data and a recovered clock signal, detecting transmission loss in the received signals from the voltage signals, encoding the first and second transmission loss signals as the encoded transmission loss signal, and outputting the encoded transmission loss as the error detection signal;

a second PLL for generating a second synchronized clock signal synchronized with the recovered clock signal; and a data recovery unit for recovering the received recovered serial n-bit channel data to n-bit parallel data in response to the second synchronized clock signal.

11. The optical transmission system of claim 10, wherein the error detection unit comprises:

first and second signal receivers for converting the current signals converted by the plurality of first and second optical receiver diodes into voltage signals, outputting the voltage signals, digitizing the voltage signals into the digital signals, and providing the digital signals as the received serial n-bit channel data and the recovered clock signal; and a transmission error detector for detecting the transmission loss in the received signals from the voltage signals, and encoding the first and second transmission loss signals in response to the second synchronized clock signal.

12. A transmitting apparatus for receiving transmission loss data detected by an external receiving apparatus through a return optical fiber and transmitting a plurality of channel data and a clock signal to the receiving apparatus through first and second transmission optical fibers, comprising:

a PLL for generating a clock signal synchronized with a predetermined clock signal received from an external source;

a parallel/serial data converter for receiving a plurality of n-bit channel data from an external source in response to the synchronized clock signal and serializing the n-bit channel data in response to the synchronized clock signal;

a receiver optical diode for receiving and converting an error detection signal transmitted from the return optical fiber into an error detection current signal;

an error compensating driver for converting the n-bit channel data serialized by the parallel/serial data converter and the synchronized clock signal into first and second current signals respectively, converting the error detection current signal into a digital error compensation signal, decoding first and second transmission loss compensation signals from the digital error compensation signal, modulating the magnitudes of the converted first and second current signals in accordance with the corresponding first and second transmission loss compensation signals, and outputting the modulated first and second current signals as first and second driving signals; and first and second transmitting optical diodes for outputting first and second optical signals having optical output powers corresponding to the first and second driving signals through the first and second transmission optical fibers.

13. The optical transmission system of claim 12, wherein the error compensating driver comprises:

an error detection receiver for receiving the error detection current signal and converting the received error detection current signal into a digitized error compensation signal;

a transmission error compensator for recovering first and second transmission loss data signals corresponding to the transmission loss occurring in the transmission of the first and second optical signals from the error compensation signal in response to the synchronized clock signal, analog converting the recovered first and second transmission loss data signals to provide the first and second transmission loss compensation signals; and a plurality of signal drivers for converting the serialized n-bit channel data and the first synchronized clock signal into the first and second current signals, modulating the magnitudes of the converted first and second current signals in response to the corresponding first and second transmission loss compensation signals, and outputting the modulated first and second current signals as the first and second driving signals.

14. The transmitting apparatus of claim 13, wherein the error compensating driver further comprises an output controller that changes modulation currents of the first and second driving signals in response to the first and second transmission loss compensation signals.

15. The transmitting apparatus of claim 13, wherein the error compensating driver further comprises an output power controller that changes bias currents of the first and second driving signals in response to the first and second transmission loss compensation signals.

16. The transmitting apparatus of claim 13, wherein the transmission error compensator comprises:

a decoder for decoding the first and second transmission loss compensation signals from the error detection receiver to recover the transmission loss data of each corresponding first and second transmission channel; and a digital-to-analog converter for receiving the first and second transmission loss compensation signals data of each channel, converting the transmission loss data into first and second analog signals, and providing the first and second analog signals as the first and transmission loss compensation signals.

* * * * *